United States Patent
Wallikewitz et al.

(10) Patent No.: US 10,910,581 B2
(45) Date of Patent: Feb. 2, 2021

(54) ORGANIC LIGHT-EMITTING DIODE COMPRISING ELECTRON TRANSPORT LAYERS WITH DIFFERENT MATRIX COMPOUNDS

(71) Applicant: Novaled GmbH, Dresden (DE)

(72) Inventors: Bodo Wallikewitz, Dresden (DE); Carsten Rothe, Dresden (DE)

(73) Assignee: Novaled GmbH, Dresden (DE)

( * ) Notice: Subject to any disclaimer, the term of this patent is extended or adjusted under 35 U.S.C. 154(b) by 172 days.

(21) Appl. No.: 15/537,092

(22) PCT Filed: Dec. 15, 2015

(86) PCT No.: PCT/EP2015/079836
§ 371 (c)(1),
(2) Date: Jun. 16, 2017

(87) PCT Pub. No.: WO2016/096881
PCT Pub. Date: Jun. 23, 2016

(65) Prior Publication Data
US 2018/0261784 A1    Sep. 13, 2018

(30) Foreign Application Priority Data
Dec. 17, 2014   (EP) .................................... 14198655

(51) Int. Cl.
*H01L 51/50*   (2006.01)
*H01L 51/00*   (2006.01)
(Continued)

(52) U.S. Cl.
CPC ........ *H01L 51/508* (2013.01); *H01L 51/0058* (2013.01); *H01L 51/0071* (2013.01);
(Continued)

(58) Field of Classification Search
None
See application file for complete search history.

(56) References Cited

U.S. PATENT DOCUMENTS 9,196,859 B2   11/2015   Sim et al.
2007/0007882 A1*  1/2007  Fukuoka ............. H01L 51/0051
                                                             313/503
(Continued)

FOREIGN PATENT DOCUMENTS

EP    2790236 A1    10/2014

OTHER PUBLICATIONS

PCT International Search Report and Written Opinion for PCT Application No. PCT/EP2015/079836 dated Feb. 22, 2016 (8 pages).

Primary Examiner — Gregory D Clark
(74) Attorney, Agent, or Firm — Eversheds Sutherland (US) LLP

(57) ABSTRACT

The present invention relates to an organic light-emitting diode comprising an emission layer and an electron transport layer stack of at least two electron transport layers, wherein a first electron transport layer and a second electron transport layer comprises at least one matrix compound, wherein—the matrix compound or compounds of the first electron transport layer is/are different to the matrix compound or compounds of the second electron transport layer; and in addition, —the first electron transport layer comprises a dopant of a lithium halide and/or lithium organic complex; and—the second electron transport layer is free of a dopant.

23 Claims, 3 Drawing Sheets

(51) Int. Cl.
*H01L 51/52* (2006.01)
*H01L 51/56* (2006.01)
*C07F 1/02* (2006.01)

(52) U.S. Cl.
CPC ...... *H01L 51/0077* (2013.01); *H01L 51/5024* (2013.01); *H01L 51/5056* (2013.01); *H01L 51/5076* (2013.01); *H01L 51/5092* (2013.01); *H01L 51/5096* (2013.01); *H01L 51/5218* (2013.01); *H01L 51/5234* (2013.01); *H01L 51/56* (2013.01); *C07F 1/02* (2013.01); *H01L 51/0067* (2013.01); *H01L 51/0072* (2013.01)

(56) References Cited

U.S. PATENT DOCUMENTS

2007/0224448 A1* 9/2007 Ikeda ................. C09K 11/06
428/690
2014/0070178 A1* 3/2014 Lee ..................... H01L 51/508
257/40

* cited by examiner

ORGANIC LIGHT-EMITTING DIODE COMPRISING ELECTRON TRANSPORT LAYERS WITH DIFFERENT MATRIX COMPOUNDS

CROSS REFERENCE TO RELATED APPLICATIONS

This application is a U.S. national stage application of PCT/EP2015/079836, filed Dec. 15, 2015, which claims priority to European Application No. 14198655.4, filed Dec. 17, 2014. The contents of these applications are hereby incorporated by reference.

The present invention relates to an organic light-emitting diode containing electron transport layers with different matrix compounds and a method of manufacturing the same.

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency. However, there is a continuously need to improve the conductivity and to reduce the voltage to operate an OLED more efficiently.

SUMMARY

It is one object to provide an organic light-emitting diode with a reduced low voltage to efficiently operate an OLED, especially for blue emitting OLEDs but also, for example, for red, green or white emitting OLEDs, in particular for top and/or bottom emission organic light-emitting diodes (OLED).

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant.

An emission layer (EML) consists of light-emitting dopant or dopants dispersed in a suitable matrix compound.

Light-emitting dopants are for example phosphorescent or fluorescent emitters.

A non-light-emitting dopant is not selected from the group of phosphorescent or fluorescent emitters.

Contrary to the composition of an emission layer, an electron transport layer is free of light-emitting dopants.

According to the invention, the dopant of a lithium halide and/or lithium organic complex is a non-light-emitting dopant.

According to the invention, the dopant or dopants of the electron transport layer stack or electron transport layer are non-light-emitting dopants.

According to one aspect, there is provided an organic light-emitting diode (OLED) comprising an emission layer and an electron transport layer stack of at least two electron transport layers, wherein a first electron transport layer and a second electron transport layer comprises at least one organic matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant.

According to one aspect, there is provided an organic light-emitting diode (OLED) comprising an emission layer and an electron transport layer stack of at least two electron transport layers, wherein a first electron transport layer and a second electron transport layer comprises at least one organic matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the electron transport layer stack is free of a light-emitting dopant.

According to one aspect, there is provided an organic light-emitting diode (OLED) comprising an emission layer and an electron transport layer stack of at least two electron transport layers, wherein a first electron transport layer and a second electron transport layer comprises each one matrix compound, wherein the matrix compound of the first electron transport layer is different to the matrix compound of the second electron transport layer; and in addition, the first electron transport layer comprises a dopant of a lithium halide and/or lithium organic complex; and the second electron transport layer is free of a dopant; and wherein the electron transport layer stack is free of a light-emitting dopant.

According to various aspects the organic light-emitting diode as mentioned before may comprise an electron transport layer stack having preferably two to four electron transport layers and more preferred two electron transport layers or three electron transport layers.

According to various aspects the organic light-emitting diode as mentioned before may comprise an electron transport layer stack having three electron transport layers.

According to various aspects the organic light-emitting diode as mentioned before may comprise an electron injection layer; preferably the electron injection layer is arranged between the electron transport layer and the cathode electrode.

More preferred the OLED with two electron transport layers may comprise an electron injection layer.

According to various aspects the organic light-emitting diode as described above with three electron transport layers may be free of an electron injection layer.

According to the invention, the matrix compound can be an organic compound.

According to various aspects the matrix compound can be an organic compound that comprises covalently bound atoms selected from the group comprising C, H, O, N and/or P.

According to the invention, the matrix compound can be free of metal atoms.

According to the invention, the matrix compound can be free of metal atoms and majority of its covalently bound atoms is selected from C and/or N.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex, which is a non-light-emitting dopant; and the second electron transport layer is free of a dopant; wherein the electron transport layer stack is free of a light-emitting dopant; and wherein the organic light-emitting diode comprises in addition an electron injection layer, preferably the electron injection layer is arranged between the electron transport layer and the cathode electrode, wherein the electron injection layer may:
  comprises a matrix compound of a phosphine oxide compound substituted with aryl, heteroaryl or alkyl group, preferably 3-Phenyl-3H-benzo[b]dinaphtho[2,1-d:1',2'-f]phosphepine-3-oxide, and doped with a lithium halide or doped with a lithium organic complex, preferably lithium tetra(1H-pyrazol-1-yl)borate; or
  comprises a matrix compound of a phosphine oxide compound substituted with aryl, heteroaryl or alkyl group, preferably (3-(dibenzo[c,h]acridin-7-yl)phenyl) diphenylphosphine oxide or 3-Phenyl-3H-benzo[b]dinaphtho[2,1-d:1',2'-f]phosphepine-3-oxide, and doped with an elemental metal selected from a group comprising alkali, alkaline earth or rare earth metals, preferably Li, Cs, Mg, Ca, Yb, or Sm; or
  consist of a metal halide or of an organic complex, preferably LiQ, AlQ3, ZrQ4, KF or LiF, wherein Q is a 8-hydroxyquinolate;
  consist of an alkali, alkaline earth or of a rare earth metal, preferably Li, Cs, Mg, Ca, Yb, or Sm.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex, which is a non-light-emitting dopant; and the second electron transport layer is free of a dopant; According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; and wherein the electron transport layer stack is free of a light-emitting dopant; and wherein the organic light-emitting diode comprises in addition an electron injection layer, preferably the electron injection layer is arranged between the electron transport layer and the cathode electrode, wherein the electron injection layer has a layer thickness of about ≥0.5 nm to about ≤5 nm, and may:
  comprises a matrix compound of a phosphine oxide compound substituted with aryl, heteroaryl or alkyl group, preferably 3-Phenyl-3H-benzo[b]dinaphtho[2,1-d:1',2'-f]phosphepine-3-oxide, and doped with a lithium halide or doped with a lithium organic complex, preferably lithium tetra(1H-pyrazol-1-yl)borate; or
  comprises a matrix compound of a phosphine oxide compound substituted with aryl, heteroaryl or alkyl group, preferably (3-(dibenzo[c,h]acridin-7-yl)phenyl) diphenylphosphine oxide or 3-Phenyl-3H-benzo[b]dinaphtho[2,1-d:1',2'-f]phosphepine-3-oxide, and doped with an elemental metal selected from a group comprising alkali, alkaline earth or rare earth metals, preferably Li, Cs, Mg, Ca, Yb, or Sm; or
  consist of a metal halide or of an organic complex, preferably LiQ, AlQ3, ZrQ4, KF or LiF, wherein Q is a 8-hydroxyquinolate;
  consist of an alkali, alkaline earth or rare earth metal, preferably Li, Cs, Mg, Ca, Yb, or Sm.

According to various embodiments of the OLED the electron transport layer and/or electron transport layer stack, wherein the dopant is a lithium organic complex only.

According to various aspects, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or compounds of the first electron transport layer is/are different to the matrix compound or compounds of the second electron transport layer; and in addition, the first electron transport layer comprises a dopant of a lithium halide and/or lithium organic complex; and wherein the second electron transport layer is free of a dopant.

According to various aspects the organic light-emitting diode (OLED) may contain two or more electron transport layers, for example two or three electron transport layers.

According to another aspect, there is provided an organic light-emitting diode (OLED) comprising an emission layer and an electron transport layer stack of at least three electron transport layers, preferably three electron transport layers, wherein a first electron transport layer, a second electron transport layer and a third electron transport layer comprises at least one matrix compound, wherein the matrix compound or matrix compounds of the first electron transport layer is/are different to the matrix compound or matrix compounds of the second electron transport layer; and in addition, the first and third electron transport layers comprise a dopant of a lithium halide and/or lithium organic complex; and wherein the second electron transport layer is free of a dopant.

According to another aspect, there is provided an organic light-emitting diode (OLED) comprising an emission layer and an electron transport layer stack of at least three electron transport layers, preferably three electron transport layers, wherein a first electron transport layer, a second electron transport layer and a third electron transport layer comprises at least one matrix compound, wherein the matrix compound or matrix compounds of the first electron transport layer is/are different to the matrix compound or matrix compounds of the second electron transport layer;

the matrix compound or matrix compounds of the first electron transport layer is identical to the matrix compound or matrix compounds of the third electron transport layer; and in addition, the first and third electron transport layers comprise a dopant of a lithium halide and/or lithium organic complex; and wherein the second electron transport layer is free of a dopant.

According to various embodiments of the organic light-emitting diode the electron transport layer stack may have three electron transport layers, wherein the first electron transport layer and the third electron transport layer comprise the same or different matrix compound and the same or different dopant; and the second electron transport layer contains a matrix compound that differs from the matrix compound of the first and third transport layers and is free of a dopant.

According to various aspects, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or compounds of the first electron transport layer is/are different to the matrix compound or compounds of the second electron transport layer; and in addition, the first electron transport layer comprises a dopant of a lithium halide and/or lithium organic complex, which is a non-light-emitting dopant; and wherein the second electron transport layer is free of a dopant.

According to various aspects the organic light-emitting diode (OLED) may contain two or more electron transport layers, for example two or three electron transport layers.

According to another aspect, there is provided an organic light-emitting diode (OLED) comprising an emission layer and an electron transport layer stack of at least three electron transport layers, preferably three electron transport layers, wherein a first electron transport layer, a second electron transport layer and a third electron transport layer comprises at least one matrix compound, wherein the matrix compound or matrix compounds of the first electron transport layer is/are different to the matrix compound or matrix compounds of the second electron transport layer; and in addition, the first and third electron transport layers comprise a dopant of a lithium halide and/or lithium organic complex, which is a non-light-emitting dopant; and wherein the second electron transport layer is free of a dopant.

According to another aspect, there is provided an organic light-emitting diode (OLED) comprising an emission layer and an electron transport layer stack of at least three electron transport layers, preferably three electron transport layers, wherein a first electron transport layer, a second electron transport layer and a third electron transport layer comprises at least one matrix compound, wherein the matrix compound or matrix compounds of the first electron transport layer is/are different to the matrix compound or matrix compounds of the second electron transport layer;

the matrix compound or matrix compounds of the first electron transport layer is identical to the matrix compound or matrix compounds of the third electron transport layer; and in addition, the first and third electron transport layers comprise a dopant of a lithium halide and/or lithium organic complex, which is a non-light-emitting dopant; and wherein the second electron transport layer is free of a dopant.

According to various embodiments of the organic light-emitting diode the electron transport layer stack may have three electron transport layers, wherein the first electron transport layer and the third electron transport layer comprise the same or different matrix compound and the same or different dopant, which is a non-light-emitting dopant; and the second electron transport layer contains a matrix compound that differs from the matrix compound of the first and third transport layers and is free of a dopant.

According to another aspect, there is provided an organic light-emitting diode (OLED) comprising an emission layer and an electron transport layer stack of at least two electron transport layers, preferably two electron transport layers, wherein a first electron transport layer and a second electron transport layer comprises at least one matrix compound of a phosphine oxide, wherein the phosphine oxide matrix compound or phosphine oxide matrix compounds of the first electron transport layer is/are different to the phosphine oxide matrix compound or phosphine oxide matrix compounds of the second electron transport layer; and in addition, the first electron transport layer comprises a dopant of a lithium halide and/or lithium organic complex, which is a non-light-emitting dopant; and wherein the second electron transport layer is free of a dopant.

According to another aspect, there is provided an organic light-emitting diode (OLED) comprising an emission layer and an electron transport layer stack of at least three electron transport layers, preferably three electron transport layers, wherein a first electron transport layer, a second electron transport layer and a third electron transport layer comprises at least one matrix compound of a phosphine oxide, wherein the phosphine oxide matrix compound or phosphine oxide matrix compounds of the first electron transport layer is/are different to the phosphine oxide matrix compound or phosphine oxide matrix compounds of the second electron transport layer; and in addition, the first and third electron transport layers comprise a dopant of a lithium halide and/or lithium organic complex, which is a non-light-emitting dopant; and wherein the second electron transport layer is free of a dopant.

According to another aspect, there is provided an organic light-emitting diode (OLED) comprising an emission layer and an electron transport layer stack of at least three electron transport layers, preferably three electron transport layers, wherein a first electron transport layer, a second electron transport layer and a third electron transport layer comprises at least one matrix compound of a phosphine oxide, wherein the phosphine oxide matrix compound or phosphine oxide matrix compounds of the first electron transport layer is/are different to the phosphine oxide matrix compound or phosphine oxide matrix compounds of the second electron transport layer;

the phosphine oxide matrix compound or phosphine oxide matrix compounds of the first electron transport layer is identical to the phosphine oxide matrix compound or phosphine oxide matrix compounds of the third electron transport layer; and in addition, the first and third electron transport layers comprise a dopant of a lithium halide and/or lithium organic complex, which is a non-light-emitting dopant; and wherein the second electron transport layer is free of a dopant.

According to various aspects of the OLED the electron transport layer stack of three electron transport layers may contain a first electron transport layer comprising a matrix compound and at least one lithium compound and a third electron transport layer comprising a matrix compound and as a dopant at least one lithium compound, which is a non-light-emitting dopant, wherein the lithium compound of the first electron transport layer and third electron transport layer is same or different, preferably same, and the second electron transport layer contains a matrix material that is different from the first electron transport layer or preferably different from the first and third electron transport layer; and wherein the second electron transport layer is free of a dopant.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:

an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline;

a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;

a phosphine oxide compound substituted with aryl, heteroaryl or alkyl group substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide;

a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline;

a quinazoline compound substituted with aryl or heteroaryl groups, preferably 9-phenyl-9'-(4-phenyl-2-quinazolinyl)-3,3'-bi-9H-carbazole;

a benzo[h]quinazoline compound substituted with aryl or heteroaryl groups, preferably 4-(2-naphthalenyl)-2-[4-(3-quinolinyl)phenyl]-benzo[h]quinazoline;

a pyrido[3,2-h]quinazoline compound substituted with aryl or heteroaryl groups, preferably 4-(naphthalen-1-yl)-2,7,9-triphenylpyrido[3,2-h]quinazoline;

a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or an acridine compound substituted with aryl or heteroaryl groups, preferably 7-(naphthalen-2-yl)dibenzo[c,h]acridine.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the matrix compound of the first electron transport layer and/or second electron transport layer is a phosphinoxide; preferably the phosphine oxide compound is a phosphine oxide substituted with aryl, heteroaryl or alkyl group substituted with aryl, heteroaryl or alkyl groups, and more preferred the phosphine oxide compound is selected from the group comprising (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl) (phenyl) phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl) phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound of the first electron transport layer is:
- a phosphine oxide compound substituted with aryl, heteroaryl or alkyl group substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; and/or
- an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound of the second electron transport layer is selected from:
- an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline;
- a benzimidazole compound substituted with aryl, heteroaryl or alkyl groups, preferably 2-(4-(9,10-di(naphthalen-2-yl)anthracen-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;
- a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline;
- a quinazoline compound substituted with aryl or heteroaryl groups, preferably 9-phenyl-9'-(4-phenyl-2-quinazolinyl)-3,3'-bi-9H-carbazole;
- a benzo[h]quinazoline compound substituted with aryl or heteroaryl groups, preferably 4-(2-naphthalenyl)-2-[4-(3-quinolinyl)phenyl]-benzo[h]quinazoline;
- a pyrido[3,2-h]quinazoline compound substituted with aryl or heteroaryl groups, preferably 4-(naphthalen-1-yl)-2,7,9-triphenylpyrido[3,2-h]quinazoline;
- a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or
- an acridine compound substituted with aryl or heteroaryl groups, preferably 7-(naphthalen-2-yl)dibenzo[c,h]acridine.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
- an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d] imidazole.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a phosphine oxide compound substituted with aryl, heteroaryl or alkyl group substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a quinazoline compound substituted with aryl or heteroaryl groups, preferably 9-phenyl-9'-(4-phenyl-2-quinazolinyl)-3,3'-bi-9H-carbazole.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a benzo[h]quinazoline compound substituted with aryl or heteroaryl groups, preferably 4-(2-naphthalenyl)-2-[4-(3-quinolinyl)phenyl]-benzo[h]quinazoline.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a pyrido[3,2-h]quinazoline compound substituted with aryl or heteroaryl groups, preferably 4-(naphthalen-1-yl)-2,7,9-triphenylpyrido[3,2-h]quinazoline.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
 a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound is selected from:
- an acridine compound substituted with aryl or heteroaryl groups, preferably 7-(naphthalen-2-yl)dibenzo[c,h]acridine.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the matrix compound for the electron transport layers of the electron layer stack; or for the first, second and third electron transport layers; or for the first and third electron transport layer; is selected from a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenyl phosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide;
- whereby the matrix material of the second electron transport layer is selected different to the matrix material of the first electron transport layer and the optional third electron transport layer.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the first electron transport layer comprises a matrix material selected from the group comprising:
- a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl) diphenylphosphine oxide, diphenyl(5-(pyren-1-yl)pyridin-2-yl)phosphine oxide, diphenyl(4'-(pyren-1-yl)-[1,1'-biphenyl]-3-yl)phosphine oxide, phenyl bis(3-(pyren-1-yl)phenyl)phosphine oxide and/or (3'-(dibenzo[c,h]acridin-7-yl)-[1,1'-biphenyl]-4-yl)diphenylphosphine oxide, preferably (3-(dibenzo[c,h]acridin-7-yl)phenyl)diphenylphosphine oxide or (3'-(dibenzo[c,h]acridin-7-yl)-[1,1'-biphenyl]-4-yl)diphenylphosphine oxide; and/or
- a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;

the second electron transport layer (162) comprises a matrix material selected from the group comprising:
- a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline; and/or
- a quinazoline compound substituted with aryl or heteroaryl groups, preferably 9-phenyl-9'-(4-phenyl-2-quinazolinyl)-3,3'-bi-9H-carbazole; and/or
- a benzo[h]quinazoline compound substituted with aryl or heteroaryl groups, preferably 4-(2-naphthalenyl)-2-[4-(3-quinolinyl)phenyl]-benzo[h]quinazoline; and/or
- a pyrido[3,2-h]quinazoline compound substituted with aryl or heteroaryl groups, preferably 4-(naphthalen-1-yl)-2,7,9-triphenylpyrido[3,2-h]quinazoline; and/or
- a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl)phenyl]-quinoline and/or 2-[3-(6'-methyl[2,2'-bipyridin]-5-yl)-5-(9-phenanthrenyl)phenyl]-4,6-diphenyl-1,3,5-triazine; and/or
- an anthracene compound substituted with aryl or heteroaryl groups, preferably 9,10-di(2-naphthyl)anthracene, and/or 3-[3'-(10-phenyl-9-anthracenyl)[1,1'-biphenyl]-4-yl]-quinoline; and/or
- a pyren phosphine oxide compound substituted with aryl, heteroaryl or alkyl groups, preferably phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide and/or phenyl bis(3-(pyren-1-yl)phenyl)phosphine oxide; and/or
- an acridine compound substituted with aryl or heteroaryl groups, preferably 7-(naphthalen-2-yl)dibenzo[c,h]acridine;

the optional third electron transport layer comprises a matrix material selected from the group comprising:
- a phosphine oxide compound substituted with aryl heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-

(anthracen-9-yl)phenyl)(phenyl)phosphine oxide, (3-(9,10-di(naphthalen-2-yl)anthracen-2-yl)phenyl) diphenylphosphine oxide, diphenyl(5-(pyren-1-yl) pyridin-2-yl)phosphine oxide, diphenyl(4'-(pyren-1-yl)-[1,1'-biphenyl]-3-yl)phosphine oxide, phenyl bis(3-(pyren-1-yl)phenyl)phosphine oxide and/or (3'-(dibenzo[c,h]acridin-7-yl)-[1,1'-biphenyl]-4-yl) diphenylphosphine oxide, preferably (3-(dibenzo[c,h] acridin-7-yl)phenyl)diphenylphosphine oxide or (3'-(dibenzo[c,h]acridin-7-yl)-[1,1'-biphenyl]-4-yl) diphenylphosphine oxide; and/or a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d] imidazole;

whereby the matrix material of the second electron transport layer is selected different to the matrix material of the first electron transport layer and the optional third electron transport layer.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the first electron transport layer comprises a matrix material selected from the group comprising 3-(dibenzo[c,h]acridin-7-yl)phenyl)diphenylphosphine oxide, phenylbis(3-(pyren-1-yl)phenyl)phosphine oxide, 3-phenyl-3H-benzo[b]dinaphtho[2,1-d:1',2'-f]phosphepine-3-oxide, (3'-(dibenzo[c,h]acridin-7-yl)-[1,1'-biphenyl]-4-yl)diphenylphosphine oxide and/or 2-(4-(9,10-di(naphthalen-2-yl)anthracen-2-yl)phenyl)-1-phenyl-1H-benzo[d]imidazole;

the second electron transport layer comprises a matrix material selected from the group comprising 9,10-di(2-naphthyl)anthracene, 1-(4-(10-([1,1'-biphenyl]-4-yl) anthracen-9-yl)phenyl)-2-ethyl-1H-benzo[d]imidazole, 3-[3'-(10-phenyl-9-anthracenyl)[1,1'-biphenyl]-4-yl]-quinolone, diphenyl(4'-(pyren-1-yl)-[1,1'-biphenyl]-3-yl)phosphine oxide, 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline, 9-phenyl-9'-(4-phenyl-2-quinazolinyl)-3,3'-bi-9H-carbazole, 4-(2-naphthalenyl)-2-[4-(3-quinolinyl)phenyl]-benzo[h] quinazoline 4-(naphthalen-1-yl)-2,7,9-triphenylpyrido [3,2-h]quinazoline, 4,4'-bis(4,6-diphenyl-1,3,5-triazine-2-yl)biphenyl, 3-[4-(4,6-di-2-naphthalenyl-1,3,5-triazin-2-yl) phenyl]-quinolone, 7-(naphthalen-2-yl)dibenzo[c,h]acridine, and/or 2-[3-(6'-methyl[2,2'-bipyridin]-5-yl)-5-(9-phenanthrenyl)phenyl]-4,6-diphenyl-1,3,5-triazine;

the optional third electron transport layer comprises a matrix material selected from the group comprising 2-(4-(9,10-di(naphthalen-2-yl)anthracen-2-yl)phenyl)-1-phenyl-1H-benzo[d]imidazole, 3-(dibenzo[c,h]acridin-7-yl)phenyl)diphenylphosphine oxide, phenylbis (3-(pyren-1-yl)phenyl)phosphine oxide, (3'-(dibenzo[c,h]acridin-7-yl)-[1,1'-biphenyl]-4-yl) diphenylphosphine oxide and/or 3-phenyl-3H-benzo[b] dinaphtho[2,1-d:1',2'-f]phosphepine-3-oxide;

whereby the matrix material of the second electron transport layer is selected different to the matrix material of the first electron transport layer and the optional third electron transport layer.

According to one aspect, there is provided an organic light-emitting diode (OLED) comprising an emission layer and an electron transport layer stack of at least two electron transport layers, wherein a first electron transport layer and a second electron transport layer comprises at least one matrix compound, wherein the matrix compound or matrix compounds of the first electron transport layer is/are different to the matrix compound or matrix compounds of the second electron transport layer; and in addition, the first electron transport layer comprises a dopant of a lithium halide and/or lithium organic complex; and the second electron transport layer is free of a dopant; wherein the emission layer comprises a light-emitting dopant and the electron transport layer stack is free of a light-emitting dopant, and wherein the electron injection layer:

comprises a matrix compound of a phosphine oxide compound substituted with aryl, heteroaryl or alkyl group, preferably 3-Phenyl-3H-benzo[b]dinaphtho[2,1-d:1',2'-f]phosphepine-3-oxide, and doped with a lithium halide or doped with a lithium organic complex, preferably lithium tetra(1H-pyrazol-1-yl)borate; or comprises a matrix compound of a phosphine oxide compound substituted with aryl, heteroaryl or alkyl group, preferably (3-(dibenzo[c,h]acridin-7-yl)phenyl) diphenylphosphine oxide or 3-Phenyl-3H-benzo[b]dinaphtho[2,1-d:1',2'-f]phosphepine-3-oxide, and doped with an elemental metal selected from a group comprising alkali, alkaline earth or rare earth metals, preferably Li, Cs, Mg, Ca, Yb, or Sm; or consist of a metal halide or organic complex, preferably LiQ, AlQ3, ZrQ4, KF or LiF, wherein Q is a 8-hydroxyquinolate; or consist of a alkali, alkaline earth or rare earth metal, preferably Li, Cs, Mg, Ca, Yb, or Sm.

According to various aspects of the OLED the electron transport layers of the electron transport layer stack, preferably the first electron transport layer and the second electron transport layer; or further preferred the first electron transport layer, the second electron transport layer and the third electron transport layer; may have similar or identical energy levels, more preferred the off-set in LUMO level is about ≤0.3 eV, and further more preferred the off-set in LUMO level is about ≤0.2 eV.

According to another aspect, there is provided an organic light-emitting diode (OLED) comprising an emission layer and an electron transport layer stack of at least two electron transport layers, preferably two electron transport layers, wherein a first electron transport layer and a second electron transport layer comprises at least one matrix compound of a phosphine oxide, wherein the phosphine oxide matrix compound or phosphine oxide matrix compounds of the first electron transport layer is/are different to the phosphine oxide matrix compound or phosphine oxide matrix compounds of the second electron transport layer; and in addition, the first electron transport layer comprises a dopant of a lithium halide and/or lithium organic complex, which is a non-light-emitting dopant; and wherein the second electron transport layer is free of a dopant; and wherein the first electron transport layer, the second electron transport layer and optional a third electron transport layer, may have similar or identical energy levels, more preferred the off-set in LUMO level is about ≤0.3 eV, and further more preferred the off-set in LUMO level is about ≤0.2 eV.

For the following defined terms, these definitions shall be applied, unless a different definition is given in the claims or elsewhere in this specification.

In the context of the present specification the term "different" or "differs" in connection with the matrix material means that the matrix material differs in their structural formula.

In the context of the present specification the term "dopant" as used in connection with an electron transport layer (ETL) or electron transport layer stack means a dopant, which is a non-light-emitting dopant. A non-light-emitting dopant does not contribute to the emission spectrum of the device. In other words, the non-light-emitting dopant is essentially non-emissive in the visible region of the electromagnetic spectrum, which are wavelengths of about ≥380 nm to about ≤780 nm.

In the context of the present specification the term "essentially non-emissive" means that the contribution of the non-light-emitting dopant to the emission spectrum from the device is less than 10%, preferably less than 5% relative to the emission spectrum.

The non-light-emitting dopant may emit in the ultraviolet region of the electromagnetic spectrum.

In the context of the present specification the term "dopant" as used in connection with an emission layer (EML) means a dopant, which is a light-emitting dopant.

In the context of the present specification the term "different" or "differs" in connection with the lithium compound means that the lithium compound differs in their structural formula.

The external quantum efficiency, also named EQE, is measured in percent (%).

The lifetime, also named LT, between starting brightness and 97% of the original brightness is measured in hours (h).

The voltage, also named V, is measured in Volt (V) at 10 milliAmpere per square centimetre (mA/cm$^2$) in bottom emission devices and at 15 mA/cm$^2$ for top emission devices.

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED" and "organic light-emitting diode" is simultaneously used and having the same meaning.

The term "electron transport layer stack" as used in the specification comprises at least two electron transport layers or at least three electron transport layers.

The term "different compound" as used in connection with the matrix compound means that the matrix compound differs from the other matrix compound in its chemical formula.

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer are selected such that it does not exceed 100 wt.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

The term "alkyl" refers to straight-chain or branched alkyl groups. The term "1 to 20 carbon atoms" as used herein refers to straight-chain or branched alkyl groups having 1 to 20 carbon atoms. The alkyl groups can be selected from the group comprising methyl, ethyl and the isomers of propyl, butyl or pentyl, such as isopropyl, isobutyl, tert.-butyl, sec.-butyl and/or isopentyl. The term "aryl" refers to aromatic groups for example phenyl or naphthyl.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

According to various aspects of the OLED the electron transport layer and/or electron transport layer stack is free of elemental metal.

According to various aspects of the OLED the electron transport layer stack may contain at least one electron transport layer, preferably the second electron transport layer, which is free of a metal salt and/or a metal organic complex.

According to various aspects of the OLED the electron transport layer stack contains at least one electron transport layer, preferably the second electron transport layer, which is free of a lithium compound selected from the group lithium halide and/or lithium organic complex.

In the context that the electron transport layer or layers are free of a dopant, metal salt, and/or metal organic complex, the term "free of" means that the so called "free off" electron transport layer or layers may comprise of about 5 wt.-% or less of a dopant, metal salt and/or a metal organic complex, preferably about 0.5 wt.-% or less, and more preferably about 0.05 wt.-% or less, and even more preferably about 0.005 wt.-% or less of a dopant, a metal salt and/or metal organic complex and most preferred is free of a dopant, metal salt and/or a metal organic complex.

According to various aspects, there is provided an organic light-emitting diode, whereby the organic light-emitting diode may not contain a charge generation layer (CGL).

According to various aspects, wherein for an OLED comprising two electron transport layer or three electron transport layers the OLED may contain at least one electron injection layer.

According to various aspects, wherein for an electron transport layer stack of at least two electron transport layers the first electron transport layer is arranged closest to an emission layer and the second electron transport layer is arranged closest to a cathode.

According to various aspects, wherein for an electron transport layer stack of at least two electron transport layers the first electron transport layer is in direct contact with an emission layer and the second electron transport layer is in direct contact with the first electron transport layer.

According to various aspects, wherein for an electron transport layer stack of at least two electron transport layers the first electron transport layer is in direct contact with an emission layer, the second electron transport layer is in direct contact with the first electron transport layer and the second electron transport layer is in direct contact with a third electron transport layer or electron injection layer or cathode.

According to various aspects, wherein for an electron transport layer stack of at least two electron transport layers the first electron transport layer is in direct contact with an emission layer, the second electron transport layer is in direct contact with the first electron transport layer, the second electron transport layer is in direct contact with an electron injection layer and the electron injection layer is in direct contact with a cathode.

According to various aspects, wherein for an electron transport layer stack of at least two electron transport layers the first electron transport layer is in direct contact with an emission layer, the second electron transport layer is in direct contact with the first electron transport layer, the second electron transport layer is in direct contact with a third electron transport layer and the third electron transport layer is in direct contact with the cathode.

According to various aspects, wherein for an electron transport layer stack of three electron transport layers the first electron transport layer is arranged closest to an emission layer, the second electron layer is sandwiched between the first and the third electron transport layer and the third electron transport layer is arranged closest to a cathode.

The organic light-emitting diode can be a bottom emission OLED or a top emission OLED.

Dopant

The non-light-emitting dopant or dopants that can be used for the electron transport layer stack or electron transport layer a dopants that are not phosphorescent or fluorescent emitter.

According to various aspects the lithium halide dopant, which is a non-light-emitting dopant, can be selected from the group comprising LiF, LiCl, LiBr or LiJ, and preferably LiF.

According to various aspects the dopant of a lithium compound, which is a non-light-emitting dopant, can be a lithium organic complex and preferably the dopant of the lithium compound can be selected from the group comprising a lithium quinolate, a lithium borate, a lithium phenolate, a lithium pyridinolate or a lithium Schiff base and lithium fluoride, preferably a lithium 2-(diphenylphosphoryl)-phenolate, lithium tetra(1H-pyrazol-1-yl)borate, a lithium quinolate of formula (III), a lithium 2-(pyridin-2-yl)phenolate and LiF, and more preferred selected from the group comprising a lithium 2-(diphenylphosphoryl)-phenolate, lithium tetra(1H-pyrazol-1-yl)borate, a lithium quinolate of formula (III) and a lithium 2-(pyridin-2-yl)phenolate.

More preferably the lithium organic complex, which is a non-light-emitting dopant, can be selected from the group comprising a lithium quinolate, a lithium borate, a lithium phenolate, a lithium pyridinolate or a lithium Schiff base; preferably the lithium organic complex, is selected from the group comprising a lithium quinolate, a lithium borate, a lithium phenolate, a lithium pyridinolate or a lithium Schiff base;

preferably the lithium quinolate has the formula I, II or III:

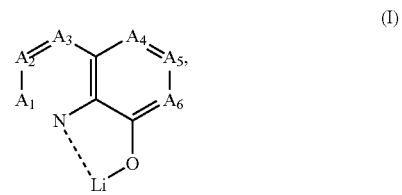

(I)

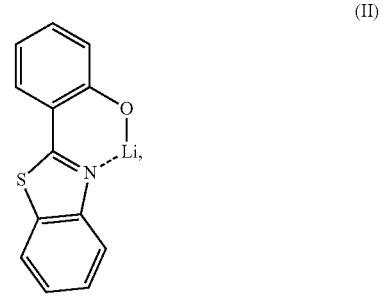

(II)

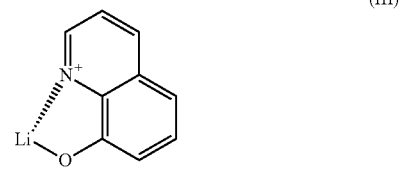

(III)

wherein

A1 to A6 are same or independently selected from CH, CR, N, O;

R is same or independently selected from hydrogen, halogen, alkyl or aryl or heteroaryl with 1 to 20 carbon atoms; and more preferred A1 to A6 are CH;

preferably the lithium borate is a lithium tetra(1H-pyrazol-1-yl)borate;

preferably the lithium phenolate is a lithium 2-(pyridin-2-yl)phenolate, a lithium 2-(diphenylphosphoryl)phenolate, a lithium imidazol phenolates, or a lithium 2-(pyridin-2-yl)phenolate and more preferred a lithium 2-(1-phenyl-1H-benzo[d]imidazol-2-yl)phenolate, or a lithium 2-(benzo[d]oxazol-2-yl)phenolate;

preferably the lithium pyridinolate is a lithium 2-(diphenylphosphoryl)pyridin-3-olate, preferably the lithium Schiff base has the structure 100, 101, 102 or 103:

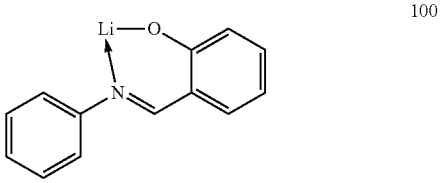

100 zol-2-yl)phenolate. Oxazol phenolate ligands that can be suitable used are disclosed in US 20030165711.

Lithium Schiff base organic complexes can be use. Lithium Schiff base organic complexes, which are not a light-emitting dopants, that can be suitable used having the structure 100, 101, 102 or 103:

Suitable organic ligands to form a lithium organic complex, which is a non-light-emitting dopant, that can be used for the first electron transport layer and/or the second electron transport layer are disclosed, for example in US 2014/0048792 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

Quinolates that can be suitable used are disclosed in WO 2013079217 A1.

According to various embodiments of the organic light-emitting diode (OLED) of the present invention the organic ligand of the lithium organic complex, which is a non-light-emitting dopant, can be a borate based organic ligand. Preferably the lithium organic complex, which is a non-light-emitting dopant, is a lithium tetra(1H-pyrazol-1-yl) borate. Borate based organic ligands that can be suitable used are disclosed in WO 2013079676 A1.

According to various embodiments of the organic light-emitting diode (OLED) of the present invention the organic ligand of the lithium organic complex, which is a non-light-emitting dopant, can be a phenolate ligand. Preferably the lithium organic complex is a lithium 2-(diphenylphosphoryl)phenolate. Phenolate ligands that can be suitable used are disclosed in WO 2013079678 A1.

Further, phenolate ligands can be selected from the group comprising pyridinolate, preferably 2-(diphenylphosphoryl) pyridin-3-olate. Pyridine phenolate ligands that can be suitable used are disclosed in JP 2008195623.

In addition, phenolate ligands can be selected from the group comprising imidazol phenolates, preferably 2-(1-phenyl-1H-benzo[d]imidazol-2-yl)phenolate. Imidazol phenolate ligands that can be suitable used are disclosed in JP 2001291593.

Also, phenolate ligands can be selected from the group comprising oxazol phenolates, preferably 2-(benzo[d]oxa- Suitable lithium organic complexes, which is a non-light-emitting dopant, that can be most preferably used for the electron transport layer are summarized in Table 1 below.

TABLE 1

| | Lithium organic complex that can be suitable used | | |
|---|---|---|---|
| | IUPAC name | Structure | Reference |
| LiQ | lithium 8-hydroxyquinolate | | WO 2013079217 A1 |

TABLE 1-continued

Lithium organic complex that can be suitable used

| | IUPAC name | Structure | Reference |
|---|---|---|---|
| Li-1 | lithium tetra(1H-pyrazol-1-yl)borate | 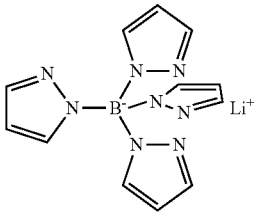 [SMILES: c1cnn([B-](n2cccn2)(n2cccn2)n2cccn2)c1 ; [Li+]] | WO 2013079676 A1 |
| Li-2 | lithium 2-(diphenyl-phosphoryl)phenolate | 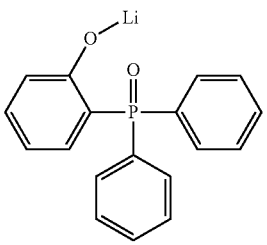 | WO 2013079678A1 |
| Li-3 | lithium 2-(pyridin-2-yl)phenolate | 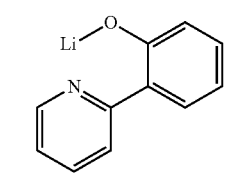 | JP2 008195623 |
| Li-4 | lithium 2-(1-phenyl-1H-benzo[d]imidazol-2-yl)phenolate | 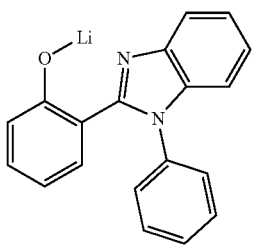 | JP 2001291593 |
| Li-5 | lithium 2-(benzo[d]oxazol-2-yl)phenolate | 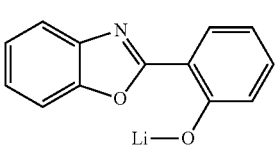 | US 20030165711 |
| Li-6 | lithium 2-(diphenyl-phosphoryl)pyridin-3-olate |  | EP 2724388 |

According to various embodiments of the organic light-emitting diode, wherein
the first electron transport layer may comprise about ≥10 wt.-% to about ≤70 wt.-%, preferably about ≥20 wt.-% to about ≤65 wt.-%, and also preferred about ≥50 wt.-% to about ≤60 wt.-% of a lithium halide or a lithium organic complex, which is a non-light-emitting dopant;
or
the first electron transport layer and the third electron transport layer may comprise each about ≥10 wt.-% to about ≤70 wt.-%, preferably about ≥20 wt.-% to about ≤65 wt.-% and also preferred about ≥50 wt.-% to about ≤60 wt.-% of a lithium halide or a lithium organic complex, which is a non-light-emitting dopant;
wherein the weight percent of the lithium halide and the lithium organic complex is based on the total weight of the corresponding electron transport layer.

Matrix Compounds

According to various embodiments of the organic light-emitting diode (OLED) of the present invention the electron transport layer or the electron transport layers of an electron transport layer stack, may comprise at least one matrix compound each.

According to various embodiments of the organic light-emitting diode, wherein the first electron transport layer and/or the third electron transport layer may comprise of at least one matrix compound.

According to various embodiments of the organic light-emitting diode, wherein the first electron transport layer and/or the third electron transport layer may comprise independent of each other one, two, three or more matrix compounds, preferably one matrix compound; whereby the matrix compound or matrix compounds selected same or different.

According to various embodiments of the organic light-emitting diode, wherein the second electron transport layer may consist of at least one matrix compound.

According to various embodiments the organic light-emitting diode (OLED) may comprise an electron transport layer stack of at least two electron transport layers or at least three electron transport layers, wherein each electron transport layer comprises at least one matrix compound, whereby the matrix compound of the first and third electron transport layers are selected same or different; and whereby the matrix compound of the second electron transport layer is different to the first electron transport layer, or is different to the first and third electron transport layer or is different to all other electron transport layer/s.

According to various embodiments of the organic light-emitting diode (OLED) the matrix compound can be selected from:
  an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline;
  a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;
  a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl) phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide;
  a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline;
  a quinazoline compound substituted with aryl or heteroaryl groups, preferably 9-phenyl-9'-(4-phenyl-2-quinazolinyl)-3,3'-bi-9H-carbazole;
  a benzo[h]quinazoline compound substituted with aryl or heteroaryl groups, preferably 4-(2-naphthalenyl)-2-[4-(3-quinolinyl)phenyl]-benzo[11]quinazoline;
  a pyrido[3,2-h]quinazoline compound substituted with aryl or heteroaryl groups, preferably 4-(naphthalen-1-yl)-2,7,9-triphenylpyrido[3,2-h]quinazoline;
  a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or
  an acridine compound substituted with aryl or heteroaryl groups, preferably 7-(naphthalen-2-yl)dibenzo[c,h]acridine.

According to various embodiments of the organic light-emitting diode (OLED) the at least two electron transport layers or the at least three electron transport layers of an electron transport layer stack comprise at least one matrix compound, whereby the matrix compound of the first electron transport layer and third electron transport layer are selected same or different; and wherein the matrix compound of the second electron transport layer differs from the first electron transport layer or differs from the first electron transport layer and third electron transport layer; whereby the matrix compound can be selected from:
  an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline;
  a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;
  a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl) phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide;
  a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline;
  a quinazoline compound substituted with aryl or heteroaryl groups, preferably 9-phenyl-9'-(4-phenyl-2-quinazolinyl)-3,3'-bi-9H-carbazole;
  a benzo[h]quinazoline compound substituted with aryl or heteroaryl groups, preferably 4-(2-naphthalenyl)-2-[4-(3-quinolinyl)phenyl]-benzo[h]quinazoline;
  a pyrido[3,2-h]quinazoline compound substituted with aryl or heteroaryl groups, preferably 4-(naphthalen-1-yl)-2,7,9-triphenylpyrido[3,2-h]quinazoline;
  a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or
  an acridine compound substituted with aryl or heteroaryl groups, preferably 7-(naphthalen-2-yl)dibenzo[c,h]acridine.

According to various embodiments of the organic light-emitting diode (OLED) a matrix compound for the electron transport layer can be more preferred; whereby the matrix compound of the second electron transport layer that differs from the first electron transport layer or first and third electron transport layer or all other electron transport layers can be selected from a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to one aspect the matrix compound for the electron transport layers of the electron layer stack can be selected from a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenyl phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to another aspect the matrix compound for the electron transport layers of the first, second and third electron transport layers can be selected from a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenyl phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to another aspect the matrix compound for the electron transport layers of the first and third electron transport layers can be selected from a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenyl phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to another aspect the OLED may comprises
a first electron transport layer comprising a matrix material selected from the group of:
  a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, diphenyl(5-(pyren-1-yl)pyridin-2-yl)phosphine oxide, diphenyl(4'-(pyren-1-yl)-[1,1'-biphenyl]-3-yl)phosphine oxide, phenyl bis(3-(pyren-1-yl)phenyl)phosphine oxide and/or (3'-(dibenzo[c,h]acridin-7-yl)-[1,1'-biphenyl]-4-yl)diphenylphosphine oxide, preferably (3-(dibenzo[c,h]acridin-7-yl)phenyl)diphenylphosphine oxide or (3'-(dibenzo[c,h]acridin-7-yl)-[1,1'-biphenyl]-4-yl)diphenylphosphine oxide; and/or
  a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;
a second electron transport layer comprising a matrix material selected from the group of:
  a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline; and/or
  a quinazoline compound substituted with aryl or heteroaryl groups, preferably 9-phenyl-9'-(4-phenyl-2-quinazolinyl)-3,3'-bi-9H-carbazole; and/or
  a benzo[h]quinazoline compound substituted with aryl or heteroaryl groups, preferably 4-(2-naphthalenyl)-2-[4-(3-quinolinyl)phenyl]-benzo[h]quinazoline; and/or
  a pyrido[3,2-h]quinazoline compound substituted with aryl or heteroaryl groups, preferably 4-(naphthalen-1-yl)-2,7,9-triphenylpyrido[3,2-h]quinazoline; and/or
  a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]-quinoline and/or 2-[3-(6'-methyl[2,2'-bipyridin]-5-yl)-5-(9-phenanthrenyl) phenyl]-4,6-diphenyl-1,3,5-triazine; and/or
  an anthracene compound substituted with aryl, heteroaryl or alkyl groups, preferably 2-(4-(9,10-di(naphthalen-2-yl)anthracene-2-yl)phenyl)-1-phenyl-1H-benzo[d]imidazole, 9,10-di(2-naphthyl)anthracene, 1-(4-(10-([1,1'-biphenyl]-4-yl)anthracen-9-yl)phenyl)-2-ethyl-1H-benzo[d]imidazole and/or 3-[3'-(10-phenyl-9-anthracenyl)[1,1'-biphenyl]-4-yl]-quinoline, preferably 2-(4-(9,10-di(naphthalen-2-yl)anthracen-2-yl)phenyl)-1-phenyl-1H-benzo[d]imidazole; and/or
  a pyren phosphine oxide compound substituted with aryl, heteroaryl or alkyl groups, preferably phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide and/or phenyl bis(3-(pyren-1-yl)phenyl)phosphine oxide; and/or
  an acridine compound substituted with aryl or heteroaryl groups, preferably 7-(naphthalen-2-yl)dibenzo[c,h]acridine; and/or
an optional third electron transport layer comprising a matrix material selected from the group of:
  a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, diphenyl(5-(pyren-1-yl)pyridin-2-yl)phosphine oxide, diphenyl(4'-(pyren-1-yl)-[1,1'-biphenyl]-3-yl)phosphine oxide, phenyl bis(3-(pyren-1-yl)phenyl)phosphine oxide and/or (3'-(dibenzo[c,h]acridin-7-yl)-[1,1'-biphenyl]-4-yl)diphenylphosphine oxide, preferably (3-(dibenzo[c,h]acridin-7-yl)phenyl)diphenylphosphine oxide or (3'-(dibenzo[c,h]acridin-7-yl)-[1,1'-biphenyl]-4-yl)diphenylphosphine oxide; and/or a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;

whereby the matrix material of the second electron transport layer is selected different to the matrix material of the first electron transport layer and the optional third electron transport layer.

According to another aspect the OLED may comprises a first electron transport layer comprising a matrix material selected from the group of 3-(dibenzo[c,h]acridin-7-yl)phenyl)diphenylphosphine oxide, phenylbis(3-(pyren-1-yl)phenyl)phosphine oxide, 3-phenyl-3H-benzo[b]dinaphtho[2,1-d:1',2'-f]phosphepine-3-oxide, (3'-(dibenzo[c,h]acridin-7-yl)-[1,1'-biphenyl]-4-yl)diphenylphosphine oxide and/or 2-(4-(9,10-di(naphthalen-2-yl)anthracen-2-yl)phenyl)-1-phenyl-1H-benzo[d]imidazole;

a second electron transport layer comprising a matrix material selected from the group of 9,10-di(2-naphthyl)anthracene, 1-(4-(10-([1,1'-biphenyl]-4-yl)anthracen-9-yl)phenyl)-2-ethyl-1H-benzo[d]imidazole, 3-[3'-(10-phenyl-9-anthracenyl)[1,1'-biphenyl]-4-yl]-quinolone, diphenyl(4'-(pyren-1-yl)-[1,1'-biphenyl]-3-yl)phosphine oxide, 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline, 9-phenyl-9'-(4-phenyl-2-quinazolinyl)-3,3'-bi-9H-carbazole, 4-(2-naphthalenyl)-2-[4-(3-quinolinyl)phenyl]-benzo[h]quinazoline 4-(naphthalen-1-yl)-2,7,9-triphenylpyrido[3,2-h]quinazoline, 4,4'-bis(4,6-diphenyl-1,3,5-triazine-2-yl)biphenyl, 3-[4-(4,6-di-2-naphthalenyl-1,3,5-triazin-2-yl) phenyl]-quinolone, and/or 2-[3-(6'-methyl[2,2'-bipyridin]-5-yl)-5-(9-phenanthrenyl) phenyl]-4,6-diphenyl-1,3,5-triazine, and/or 7-(naphthalen-2-yl)dibenzo[c,h]acridine;

an optional third electron transport layer comprising a matrix material selected from the group comprising 2-(4-(9,10-di(naphthalen-2-yl)anthracen-2-yl)phenyl)-1-phenyl-1H-benzo[d]imidazole, 3-(dibenzo[c,h]acridin-7-yl)phenyl)diphenylphosphine oxide, phenylbis(3-(pyren-1-yl)phenyl)phosphine oxide, (3'-(dibenzo[c,h]acridin-7-yl)-[1,1'-biphenyl]-4-yl) diphenylphosphine oxide and/or 3-phenyl-3H-benzo[b]dinaphtho[2,1-d:1',2'-f]phosphepine-3-oxide;

whereby the matrix material of the second electron transport layer is selected different to the matrix material of the first electron transport layer and the optional third electron transport layer.

According to another aspect the matrix compound of the first electron transport layer or of the first and third electron transport layer can be (3-(dibenzo[c,h]acridin-7-yl)phenyl)diphenylphosphine oxide or (3'-(dibenzo[c,h]acridin-7-yl)-[1,1'-biphenyl]-4-yl)diphenylphosphine oxide and the matrix compound of the second electron transport layer can be 4,7-diphenyl-2,9-di-p-tolyl-1,10-phenanthroline and/or 4-(naphthalen-1-yl)-2,7,9-triphenylpyrido[3,2-h]quinazoline and/or 4,4'-bis(4,6-diphenyl-1,3,5-triazin-2-yl)biphenyl and/or 3-phenyl-3H-benzo[b]dinaphtho[2,1-d:1',2'-f]phosphepine-3-oxide.

According to another aspect the first and third electron transport layer may consist of one matrix compound and one dopant, which is a non-light-emitting dopant, and the second electron transport layer may consist of one matrix compound.

According to another aspect the first electron transport layer may consist of one matrix compound and one dopant, which is a non-light-emitting dopant, and the second electron transport layer may consist of one matrix compound.

According to another aspect the second electron transport layer may consist of one matrix compound.

Suitable matrix compounds that can be suitable used for the electron transport layer are summarized in Table 2 below.

TABLE 2

Chemical structures of matrix compounds that can be suitable used

| Compound | Name | Structure | Reference |
|---|---|---|---|
| MX 1 | 2-(4-(9,10-di(naphthalen-2-yl)anthracen-2-yl)phenyl)-1-phenyl-1H-benzo[d]imidazole | | US 6878469 |

TABLE 2-continued

Chemical structures of matrix compounds that can be suitable used

| Compound | Name | Structure | Reference |
|---|---|---|---|
| MX 2 | 9,10-di(2-naphthyl)anthracene | | US5935721 |
| MX 3 | 3-[3'-(10-phenyl-9-anthracenyl) [1,1'-biphenyl]-4-yl]-quinoline | | KR2011018195 |
| MX 4 | 1-(4-(10-([1,1'-biphenyl]-4-yl)anthracen-9-yl)phenyl)-2-ethyl-1H-benzo[d]imidazole | | WO2010134352 |
| MX 5 | (3-(9,10-di(naphthalen-2-yl)anthracen-2-yl)phenyl)diphenylphosphine oxide | | EP13187905.8 |

TABLE 2-continued

Chemical structures of matrix compounds that can be suitable used

| Compound | Name | Structure | Reference |
|---|---|---|---|
| MX 6 | bis(4-(anthracen-9-yl)phenyl)(phenyl)phosphine oxide | | EP13187905.8 |
| MX 7 | Phenyldi(pyren-1-yl)phosphine oxide | | JP4876333 |
| MX 8 | Phenylbis(3-(pyren-1-yl)phenyl)phosphine oxide | | EP13187905.8 |

TABLE 2-continued

Chemical structures of matrix compounds that can be suitable used

| Compound | Name | Structure | Reference |
|---|---|---|---|
| MX 9 | diphenyl(4'-(pyren-1-yl)-[1,1'-biphenyl]-3-yl)phosphine oxide | | EP13187905.8 |
| MX 10 | diphenyl(5-(pyren-1-yl)pyridin-2-yl)phosphine oxide | | WO2014167020 |
| MX 11 | (3-(dibenzo[c,h]acridin-7-yl)phenyl)diphenylphosphine oxide | | EP 2395571, WO2013079217 |
| MX 12 | 3-Phenyl-3H-benzo[b]dinaphtho[2,1-d:1',2'-f]phosphepine-3-oxide | | EP13199361.0 |

TABLE 2-continued

Chemical structures of matrix compounds that can be suitable used

| Compound | Name | Structure | Reference |
|---|---|---|---|
| MX 13 | 2,4,7,9-tetraphenyl-1,10-phenanthroline | | EP1786050 |
| MX 14 | 4,7-diphenyl-2,9-di-p-tolyl-1,10-phenanthroline | | EP1786050 |
| MX 15 | 2,9-di(biphenyl-4-yl)-4,7-diphenyl-1,10-phenanthroline | | EP1786050 |
| MX 16 | 3,8-bis(6-phenyl-2-pyridinyl-1,10-phenanthroline | | CN102372708 |

TABLE 2-continued

Chemical structures of matrix compounds that can be suitable used

| Compound | Name | Structure | Reference |
|---|---|---|---|
| MX 17 | 9-phenyl-9'-(4-phenyl-2-quinazolinyl)-3,3'-bi-9H-carbazole | | KR2012102374 |
| MX 18 | 4-(2-naphthalenyl)-2-[4-(3-quinolinyl)phenyl]-benzo[h]quinazoline | | KR2014076522 |
| MX 19 | 4-(naphthalen-1-yl)-2,7,9-triphenylpyrido[3,2-h]quinazoline | | EP1970371 |

TABLE 2-continued

Chemical structures of matrix compounds that can be suitable used

| Compound | Name | Structure | Reference |
|---|---|---|---|
| MX 20 | 4,4'-bis(4,6-diphenyl-1,3,5-triazine-2-yl)biphenyl | | US6225467 |
| MX 21 | 3-[4-(4,6-di-2-naphthalenyl-1,3,5-triazin-2-yl)phenyl]-quinoline | | US20110156013 |
| MX 22 | 2-[3-(6'-methyl[2,2'-bipyridin]-5-yl)-5-(9-phenanthrenyl)phenyl]-4,6-diphenyl-1,3,5-triazine | | WO2014171541 |

TABLE 2-continued

Chemical structures of matrix compounds that can be suitable used

| Compound | Name | Structure | Reference |
|---|---|---|---|
| MX 23 | (3'-(dibenzo[c,h]acridin-7-yl)-[1,1'-biphenyl]-4-yl)diphenylphosphine oxide | | EP 2395571, WO2013079217 |
| MX 24 | 7-(naphthalen-2-yl)dibenzo[c,h]acridine | | EP 2395571 |
| MX 25 | | | |

According to various embodiments of the organic light-emitting diode, wherein
the first electron transport layer comprises about ≤90 wt.-% to about ≥30 wt.-%, of a matrix compound; or
the first electron transport layer and the third electron transport layer comprises each about ≤90 wt.-% to about ≥30 wt.-%, of a matrix compound;
wherein the weight percent of the matrix compound is based on the total weight of the corresponding transport layer According to various embodiments of the organic light-emitting diode, wherein
the first electron transport layer may comprise about ≤80 wt.-% to about ≤35 wt.-% of a matrix compound; or
the first electron transport layer and the third electron transport layer comprises each about ≤80 wt.-% to about ≥35 wt.-% of a matrix compound;
wherein the weight percent of the matrix compound is based on the total weight of the corresponding transport layer.

According to various embodiments of the organic light-emitting diode, wherein
the first electron transport layer may comprise about ≤50 wt.-% to about ≥40 wt.-% of a matrix compound; or
the first electron transport layer and the third electron transport layer comprises each about ≤50 wt.-% to about ≥40 wt.-% of a matrix compound;
wherein the weight percent of the matrix compound is based on the total weight of the corresponding transport layer.

According to various embodiments of the organic light-emitting diode, wherein
the first electron transport layer may comprise about ≤10 wt.-% to about ≥70 wt.-%, of a lithium halide or a lithium organic complex; or
the first electron transport layer and the third electron transport layer may comprise each about ≥10 wt.-% to about ≤70 wt.-%, of a lithium halide or a lithium organic complex; wherein the weight percent of the lithium halide and the lithium organic complex is based on the total weight of the corresponding electron transport layer.

According to various embodiments of the organic light-emitting diode, wherein
  the first electron transport layer may comprise about ≥20 wt.-% to about ≤65 wt.-%, of a lithium halide or a lithium organic complex; or
  the first electron transport layer and the third electron transport layer may comprise each about ≥20 wt.-% to about ≤65 wt.-%, of a lithium halide or a lithium organic complex;
wherein the weight percent of the lithium halide and the lithium organic complex is based on the total weight of the corresponding electron transport layer.

According to various embodiments of the organic light-emitting diode, wherein
  the first electron transport layer may comprise about ≥50 wt.-% to about ≤60 wt.-%, of a lithium halide or a lithium organic complex; or
  the first electron transport layer and the third electron transport layer may comprise each about ≥50 wt.-% to about ≤60 wt.-%, of a lithium halide or a lithium organic complex;
wherein the weight percent of the lithium halide and the lithium organic complex is based on the total weight of the corresponding electron transport layer.

According to various embodiments of the organic light-emitting diode, wherein
  the first electron transport layer or the first electron transport layer and third electron transport layer, comprises:
a) about ≥10 wt.-% to about ≤70 wt.-% of the dopant, which is a non-light-emitting dopant;
b) about ≤90 wt.-% to about ≥30 wt.-% of a matrix compound;
  the second electron transport layer, which is free of a dopant, comprises a matrix compound that is selected different from the first electron transport layer and the optional third electron transport layer; and
wherein the wt.-% of the components of each electron transport layer is selected such that the total wt.-% amount does not exceed 100 wt.-% and the wt.-% of the components are based on the total weight of the corresponding transport layer.

According to various embodiments of the organic light-emitting diode, wherein
  the first electron transport layer or the first electron transport layer and third electron transport layer, comprises:
a) about ≥10 wt.-% to about ≤70 wt.-% of the dopant, which is a non-light-emitting dopant;
b) about ≤90 wt.-% to about ≥30 wt.-% of a matrix compound;
  the second electron transport layer, which is free of a dopant, comprises a matrix compound that is selected different from the first electron transport layer and the optional third electron transport layer; and
wherein the wt.-% of the components of each electron transport layer is selected such that the total wt.-% amount does not exceed 100 wt.-% and the wt.-% of the components are based on the total weight of the corresponding transport layer.

According to various embodiments of the organic light-emitting diode, wherein
  the first electron transport layer or the first electron transport layer and third electron transport layer, comprises:
a) about ≥20 wt.-% to about ≤65 wt.-% of the dopant, which is a non-light-emitting dopant;
b) about ≤80 wt.-% to about ≥35 wt.-% of a matrix compound;
  the second electron transport layer, which is free of a dopant, comprises a matrix compound that is selected different from the first electron transport layer and the optional third electron transport layer; and
wherein the wt.-% of the components of each electron transport layer is selected such that the total wt.-% amount does not exceed 100 wt.-% and the wt.-% of the components are based on the total weight of the corresponding transport layer.

According to various embodiments of the organic light-emitting diode, wherein
  the first electron transport layer, or the first electron transport layer and third electron transport layer, comprises:
  a) a non-light-emitting dopant, of about ≥10 wt.-% to about ≤70 wt.-%, preferably about ≥20 wt.-% to about ≤65 wt.-% and also preferred about ≥50 wt.-% to about ≤60 wt.-% of a lithium halide, selected from the group comprising a LiF, LiCl, LiBr or LiJ, preferably LiF, or of a lithium organic complex of a lithium quinolate, a lithium borate, a lithium phenolate, a lithium pyridinolate or a lithium Schiff base; preferably of a lithium quinolate complex having the formula I, II or III:

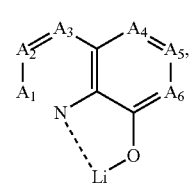

(I)

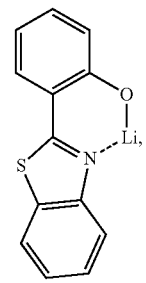

(II)

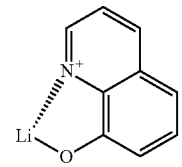

(III)

wherein
    A1 to A6 are same or independently selected from CH, CR, N, O,
    R is same or independently selected from hydrogen, halogen, alkyl or aryl or heteroaryl with 1 to 20 carbon atoms, and more preferred of a lithium 8-hydroxyquinolate; and/or a lithium borate, more preferred the lithium borate is lithium tetra(1H-pyrazol-1-yl)borate;
  b) about ≤90 wt.-% to about ≥30 wt.-%, preferably about ≤80 wt.-% to about ≥35 wt.-% and also preferred about ≤50 wt.-% to about ≥40 wt.-% and also preferred about ≤50 wt.-% to about ≥40 wt.-% of a matrix compound of:
- an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline;
- a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;
- a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide;
- a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline;
- a quinazoline compound substituted with aryl or heteroaryl groups, preferably 9-phenyl-9'-(4-phenyl-2-quinazolinyl)-3,3'-bi-9H-carbazole;
- a benzo[h]quinazoline compound substituted with aryl or heteroaryl groups, preferably 4-(2-naphthalenyl)-2-[4-(3-quinolinyl)phenyl]-benzo[h]quinazoline;
- a pyrido[3,2-h]quinazoline compound substituted with aryl or heteroaryl groups, preferably 4-(naphthalen-1-yl)-2,7,9-triphenylpyrido[3,2-h]quinazoline;
- a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or
- an acridine compound substituted with aryl or heteroaryl groups, preferably 7-(naphthalen-2-yl)dibenzo[c,h]acridine;
- the second electron transport layer (162), which is free of a dopant, comprises a matrix compound of:
  - an anthracene compound substituted with aryl, heteroaryl or alkyl groups, preferably, 9,10-di(2-naphthyl)anthracene and/or 3-[3'-(10-phenyl-9-anthracenyl)[1,1'-biphenyl]-4-yl]-quinoline;
  - a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;
  - a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide;
  - a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline;
  - a quinazoline compound substituted with aryl or heteroaryl groups, preferably 9-phenyl-9'-(4-phenyl-2-quinazolinyl)-3,3'-bi-9H-carbazole;
  - a benzo[h]quinazoline compound substituted with aryl or heteroaryl groups, preferably 4-(2-naphthalenyl)-2-[4-(3-quinolinyl)phenyl]-benzo[h]quinazoline;
  - a pyrido[3,2-h]quinazoline compound substituted with aryl or heteroaryl groups, preferably 4-(naphthalen-1-yl)-2,7,9-triphenylpyrido[3,2-h]quinazoline;
  - a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or
  - an acridine compound substituted with aryl or heteroaryl groups, preferably 7-(naphthalen-2-yl)dibenzo[c,h]acridine;
  - whereby more preferred is a phosphine oxide compound substituted with aryl, heteroaryl or alkyl group and most preferred is 3-phenyl-3H-benzo[b]dinaphtho[2,1-d:1',2'-f]phosphepine-3-oxide;

whereby the matrix compound of the first electron transport layer, or the matrix compound of the first electron transport layer and third electron transport layer, is selected different from the second electron transport layer; and the wt.-% of the components of each electron transport layer is selected such that the total wt.-% amount does not exceed 100 wt.-% and the wt.-% of the components are based on the total weight of the corresponding transport layer.

According to various embodiments of the organic light-emitting diode (OLED), the thicknesses of the first electron transport layer and/or the second electron transport layer and/or the third electron transport layer can be same or each independently in the range of about ≥1 nm to about ≤95 nm.

According to various embodiments of the organic light-emitting diode (OLED), the thicknesses of the first electron transport layer and/or the second electron transport layer and/or the third electron transport layer can be same or each independently in the range of about ≥6 nm to about ≤80 nm.

According to various embodiments of the organic light-emitting diode (OLED), the thicknesses of the first electron transport layer and/or the second electron transport layer and/or the third electron transport layer can be same or each independently in the range of, further preferred of about ≥8 nm to about ≤60 nm.

According to various embodiments of the organic light-emitting diode (OLED), the thicknesses of the first electron transport layer and/or the second electron transport layer and/or the third electron transport layer can be same or each independently in the range of about ≥10 nm to about ≤40 nm.

According to various embodiments of the organic light-emitting diode (OLED), the thicknesses of the first electron transport layer and/or the second electron transport layer and/or the third electron transport layer can be same or each independently in the range of about ≥8 nm to about ≤20 nm.

According to various embodiments of the organic light-emitting diode (OLED), the thicknesses of the first electron transport layer and/or the second electron transport layer and/or the third electron transport layer can be same or each independently in the range of about ≥10 nm to about ≤18 nm.

According to various embodiments of the organic light-emitting diode (OLED) the thicknesses of the electron transport layer stack can be in the range of about ≥25 nm to about ≤100 nm.

According to various embodiments of the organic light-emitting diode (OLED) the thicknesses of the electron transport layer stack can be in the range of about ≥30 nm to about ≤80 nm.

According to various embodiments of the organic light-emitting diode (OLED) the thicknesses of the electron transport layer stack can be in the range of about ≥35 nm to about ≤60 nm.

According to various embodiments of the organic light-emitting diode (OLED) the thicknesses of the electron transport layer stack can be in the range of about ≥36 nm to about ≤40 nm.

According to various embodiments of the organic light-emitting diode (OLED) of the present invention the electron transport layer stack has 2 to 4 electron transport layers and more preferred 2 to 3 electron transport layers.

According to various embodiments of the organic light-emitting diode (OLED) of the present invention the second electron transport layer can be arranged directly on the first electron transport layer and an optional third electron transport layer can be arranged directly on the second electron transport layer, so that the second electron transport layer is sandwiched between the first and third electron transport layers.

According to another aspect, there is provided an organic light-emitting diode comprising: a substrate; an anode electrode is formed on the substrate; an electron transport layer stack is formed on the anode electrode, whereby the electron transport layer stack comprises or consist of at least two electron transport layers; and finally a cathode electrode is formed, so that the electron transport layer stack is sandwiched between the anode electrode and the cathode electrode; and optional an electron injection layer is arranged between the electron transport layer and the cathode electrode.

According to various embodiments, the organic light-emitting diode (OLED) may further include at least one layer selected from the group consisting of a hole injection layer, a hole transport layer, an emission layer, and a hole blocking layer, arranged between the anode electrode and the electron transport layer.

According to another aspect, there is provided an organic light-emitting diode comprising in addition: at least one layer selected from the group consisting of a hole injection layer, a hole transport layer, an emission layer, and a hole blocking layer, arranged between the anode electrode and the electron transport layer stack.

According to various aspects, there is provided an organic light-emitting diode further comprising an electron injection layer arranged between the electron transport layer and the cathode electrode.

According to another aspect, there is provided an organic light-emitting diode comprising at least two electron transport layers and at least one electron injection layer. Preferably the organic light-emitting diode may comprise an electron transport layer stack having two to four electron transport layers and more preferred two electron transport layers or three electron transport layers.

According to another aspect, there is provided an organic light-emitting diode comprising an electron transport layer stack of at least three electron transport layers and at least one electron injection layer. More preferred can be an organic light-emitting diode comprising three electron transport layers and no electron injection layer.

According to another aspect the organic light-emitting diode comprising an electron transport layer stack can be free of an electron injection layer.

According to various embodiments of the OLED of the present invention, the OLED may not comprise an electron injection layer.

According to various embodiments of the OLED of the present invention, the OLED may not comprise a charge generation layer.

According to various embodiments of the OLED of the present invention, the OLED may not comprise an electron injection layer and a charge generation layer.

According to another aspect, there is provided a method of manufacturing an organic light-emitting diode (OLED), the method using:
  at least three deposition sources; and/or
  deposition via vacuum thermal evaporation; and/or
  deposition via solution processing, preferably the processing is selected from spin-coating, casting, printing and/or slot-die coating.

According to various aspects, there is provided a method using:
  a first deposition source to release the matrix compound, and
  a second deposition source to release lithium halide or lithium organic complex; the method comprising the steps of forming the electron transport layer stack;
whereby the first electron transport layer is formed by releasing the matrix compound from the first deposition source and the lithium halide or lithium organic complex from the second deposition source;
  onto the first electron transport layer the second electron transport layer is formed by releasing the matrix compound from a third deposition source;
wherein the matrix compound of the first electron transport layer is not the same as the matrix compound of the second electron transport layer.

According to various aspects, there is provided a method using:
  a first and a third deposition source to release different matrix compounds, and
  a second and a fourth deposition source to release lithium halide or lithium organic complex, which is different to the lithium halide or lithium organic complex used for the second deposition source, preferably a lithium organic complex, and
the method comprising the steps of forming the electron transport layer or the electron transport layer stack; whereby a first electron transport layer is formed by releasing the matrix compound from a first deposition source, and lithium halide or lithium organic complex from a second deposition source;

onto the first electron transport layer a second electron transport layer is formed by releasing a matrix compound, different from the first electron transport layer, via a third deposition source;

optional onto the second electron transport layer a third electron transport layer is formed by releasing the matrix compound used for the first electron transport layer via the first deposition source, and the fourth deposition source is used for releasing the lithium halide or lithium organic complex different to that used for the first electron transport layer;

whereby the second electron transport layer is free of a dopant.

According to various aspects, the method may further include forming on the anode electrode an emission layer and at least one layer selected from the group consisting of forming a hole injection layer, forming a hole transport layer, or forming a hole blocking layer, between the anode electrode and the electron transport layer stack.

According to various aspects, the method may further include the steps for forming an organic light-emitting diode (OLED), wherein on a substrate an anode electrode is formed,
on the anode electrode an emission layer is formed,
on the emission layer at least two electron transport layers are formed, whereby the second electron transport layer is free of a dopant, optional a third electron transport layer is formed directly on the second electron transport layer, whereby the matrix material of the third electron transport layer is different to the matrix material of the second electron transport layer and the matrix material, lithium halide and/or lithium organic complex of the third electron transport layer is different or same to that of the first electron transport layer,
on the electron transport layer stack a cathode electrode is formed,
optional a hole injection layer, a hole transport layer, an emission layer, and a hole blocking layer, are formed between the anode electrode and the electron transport layer stack,
optional an electron injection layer is formed between the electron transport layer or electron transport layer stack, and the cathode electrode.

According to various aspects, the method may further include the steps for forming an organic light-emitting diode (OLED), wherein an electron injection layer is formed between electron transport layer stack, and the cathode electrode.

According to various aspects, the method may further include the steps for forming an organic light-emitting diode (OLED), wherein an electron injection layer is formed between the electron transport layer stack, and the cathode electrode.

According to various aspects, the method may further include the steps for forming an organic light-emitting diode (OLED), wherein on a substrate an anode electrode is formed,
on the anode electrode an emission layer is formed,
on the emission layer an electron transport layer stack of at least a first electron transport and a second electron transport layer is formed, whereby the second electron transport layer is formed directly on the first electron transport layer and optional a third electron transport layer is formed directly on the second electron transport layer,
on the electron transport layer stack a cathode electrode is formed,
an electron injection layer is formed between the electron transport layer stack, and the cathode electrode
optional a hole injection layer, a hole transport layer, an emission layer, and a hole blocking layer, are formed between the anode electrode and the electron transport layer stack.

However, according to various embodiments of the OLED of the present invention, the OLED comprising two electron transport layers may not comprise a charge generation layer. However, according to various embodiments of the OLED of the present invention, the OLED comprising three or more electron transport layers may not comprise an electron injection layer and/or a charge generation layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
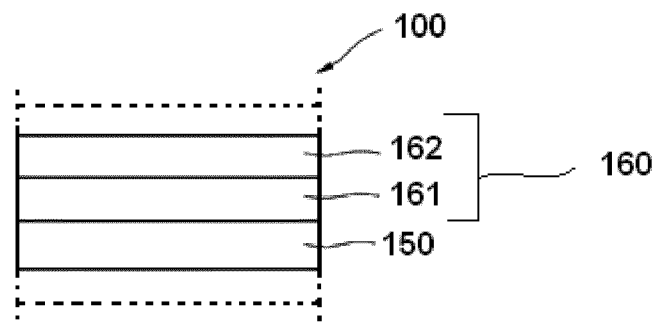
FIG. 1 is a schematic sectional view of an organic light-emitting diode (OLED), according to an exemplary embodiment of the present invention with an emission layer and two electron transport layers.

Reference will now be made in detail to the exemplary aspects, examples of which are illustrated in the accompanying drawings, wherein like reference numerals refer to the like elements throughout. The exemplary embodiments are described below, in order to explain the aspects, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode 100, according to an exemplary embodiment of the present invention. The OLED 100 includes an emission layer 150 and an electron transport layer stack (ETL) 160 comprising a first electron transport layer 161 and a second electron transport layer 162, whereby the second electron transport layer 162 is disposed directly on the first electron transport layer 161.

Figure 2:
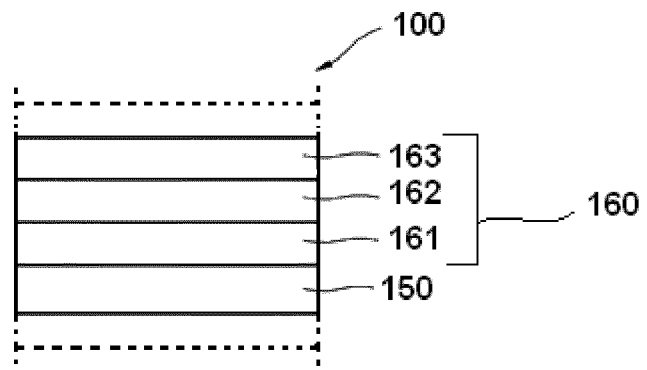
FIG. 2 is a schematic sectional view of an OLED, according to an exemplary embodiment of the present invention with an emission layer and three electron transport layers.

FIG. 2 is a schematic sectional view of an organic light-emitting diode 100, according to an exemplary embodiment of the present invention. The OLED 100 includes an emission layer 150 and an electron transport layer stack (ETL) 160 comprising a first electron transport layer 161, a second electron transport layer 162, and a third electron transport layer 163, whereby the second electron transport layer 162 is disposed directly on the first electron transport layer 161 and the third electron transport layer 163 is disposed directly on the first electron transport layer 162.

Figure 3:
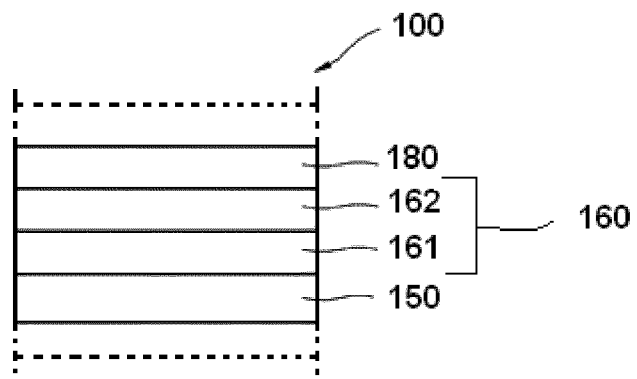
FIG. 3 is a schematic sectional view of an organic light-emitting diode (OLED), according to an exemplary embodiment of the present invention with an emission layer, two electron transport layers and an electron injection layer

FIG. 3 is a schematic sectional view of an organic light-emitting diode 100, according to an exemplary embodiment of the present invention. The OLED 100 includes an emission layer 150, an electron injection layer (EIL) 180 and an electron transport layer stack (ETL) 160 comprising a first electron transport layer 161 and a second electron transport layer 162, whereby the second electron transport layer 162 is disposed directly on the first electron transport layer 161.

Figure 4:
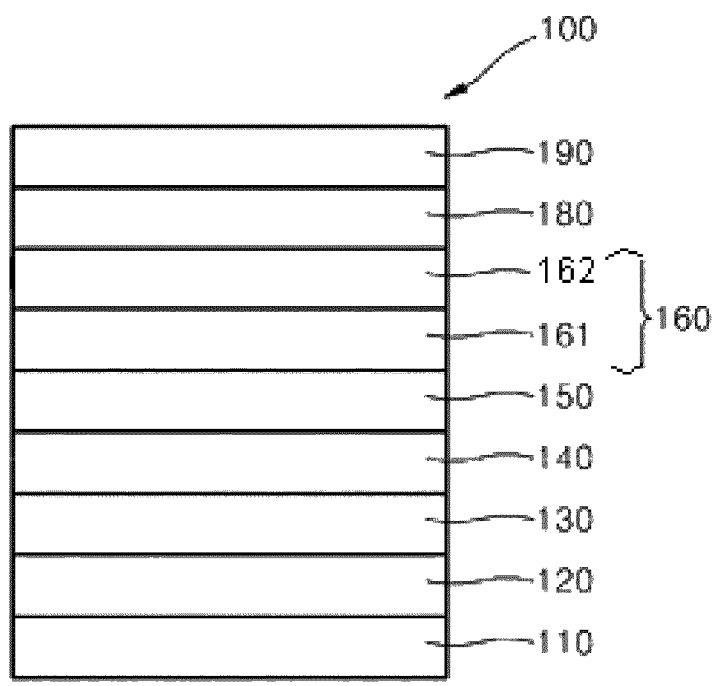
FIG. 4 is a schematic sectional view of an organic light-emitting diode (OLED), according to an exemplary embodiment of the present invention with an emission layer, two electron transport layers and an electron injection layer.

FIG. 4 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer stack (ETL) 160, an electron injection layer (EIL) 180, and a second electrode 190. The electron transport layer stack (ETL) 160 includes a first electron transport layer 161 including a matrix compound and a dopant of a lithium organic complex, which is a non-light-emitting dopant, and a second electron transport layer 162 including a matrix compound that differs from the matrix compound of the first electron transport layer 161 and is free of a dopant. The second electron transport layer 162 is directly formed on the first electron transport layer 161. The first layer 161 may be formed directly on the EML 150 and the electron injection layer (EIL) 180 may be formed directly on the second electron transport layer 162.

Figure 5:
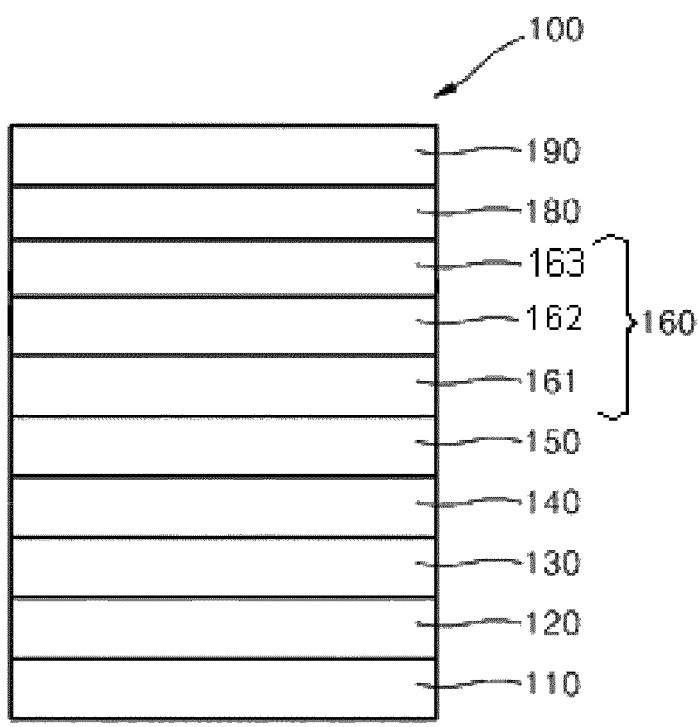
FIG. 5 is a schematic sectional view of an OLED, according to an exemplary embodiment of the present invention with an emission layer, three electron transport layers and an electron injection layer.

FIG. 5 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer stack (ETL) 160, an electron injection layer (EIL) 180, and a second electrode 190. The electron transport layer stack (ETL) 160 includes a first electron transport layer 161 and a third electron transport layer 163 including the same matrix compounds and two different lithium organic complexes; and the second electron transport layer 162 includes a matrix compound that differs from the matrix compound of the first and second electron transport layer 161/162 and is free of a dopant. The second electron transport layer 162 is directly formed on the first electron transport layer 161 and the third electron layer 163 is directly formed on the second electron layer 162. The first layer 161 may be formed directly on the emission layer (EML) 150.

The substrate 110 may be any substrate that is commonly used in manufacturing of organic light-emitting diodes. If light is emitted through the substrate, the substrate 110 may be a transparent material, for example a glass substrate or a transparent plastic substrate, having excellent mechanical strength, thermal stability, transparency, surface smoothness, ease of handling, and waterproofness. If light is emitted through the top surface, the substrate 110 may be a transparent or non-transparent material, for example a glass substrate, a plastic substrate, a metal substrate or a silicon substrate.

The anode electrode 120 may be formed by depositing or sputtering a compound that is used to form the anode electrode 120. The compound used to form the anode electrode 120 may be a high work-function compound, so as to facilitate hole injection. If a p-doped HIL is used, the anode material may also be selected from a low work function material (i.e. aluminum). The anode electrode 120 may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The HIL 130 may be formed on the anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N-bis(phenyl)-benzidine) doped with F4TCNQ. α-NPD doped with 2,2'-(perfluoronaphthalene-2, 6-diylidene) dimalononitrile (PD1). α-NPD doped with 2,2', 2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010. Examples of the compound that may be used to form the HTL 140 are: a carbazole derivative, such as N-phenylcarbazole or polyvinylcarbazole; an amine derivative having an aromatic condensation ring, such as N,N-bis(3-methylphenyl)-N,N-diphenyl-[1,1-biphenyl]-4,4'-diamine (TPD), or N,N-di(naphthalene-1-yl)-N,N-diphenyl benzydine (alpha-NPD); and a triphenylamine-based compound, such as 4,4', 4"-tris(N-carbazolyl)triphenylamine (TCTA). Among these compounds, TCTA can transport holes and inhibit excitons from being diffused into the EML.

Compounds that can be preferably used are summarized in Table 3.

TABLE 3

| Name | Structure | Reference |
|---|---|---|
| N4,N4"-di(naphthalen-1-yl)-N4,N4"-diphenyl-[1,1':4',1"-terphenyl]-4,4"-diamine | | DE102012101652 A1 |
| Biphenyl-4-yl(9,9-diphenyl-9H-fluoren-2-yl)-[4-(9-phenyl-9H-carbazol-3-yl)phenyl]-amine | | CAS 1242056-42-3 |

TABLE 3-continued

| Name | Structure | Reference |
|---|---|---|
| 2,2',2''-(cyclopropane-1,2,3-triylidene)tris(2-(p-cyanotetrafluorophenyl)acetonitrile) | 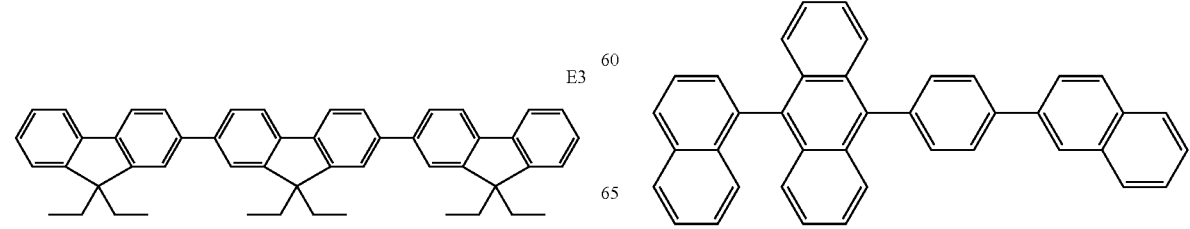 | EP 1988587 A1, EP 2180029 A1 |

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

The EML 150 may be formed on the HTL 140 by vacuum deposition, spin coating, slot-die coating, printing, casting, LB, or the like. When the EML 150 is formed using vacuum deposition or spin coating, the conditions for deposition and coating may be similar to those for the formation of the HIL 130. However, the conditions for deposition and coating may vary, according to the compound that is used to form the EML 150.

The emission layer (EML) 150 may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), distyrylarylene (DSA), Bis(2-(2-hydroxyphenyl)benzothiazolate)zinc (Zn(BTZ) 2), E3 below, ADN and referred to as Formula 1, Compound 1 below, and Compound 2 below.

E3

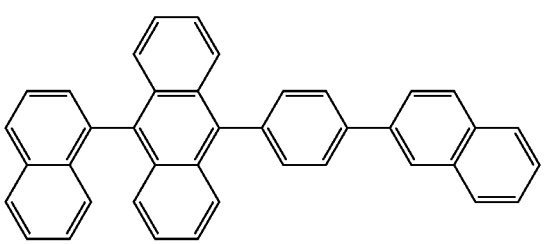

-continued

Formula 1

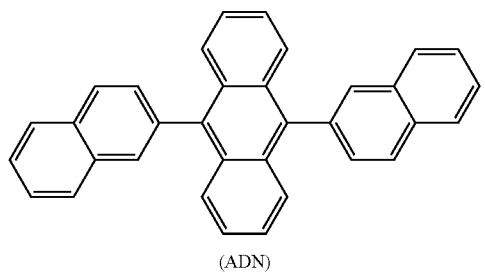

(ADN)

Compound 1

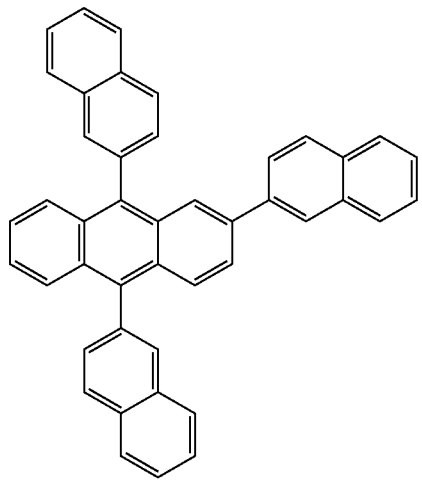

Compound 2

The dopant may be a phosphorescent or fluorescent emitter. Phosphorescent emitters are preferred due to their higher efficiency Examples of a red dopant are PtOEP, Ir(piq) 3, and Btp 2Ir(acac), but are not limited thereto. These compounds are phosphorescent emitters, however, fluorescent red dopants could also be used.

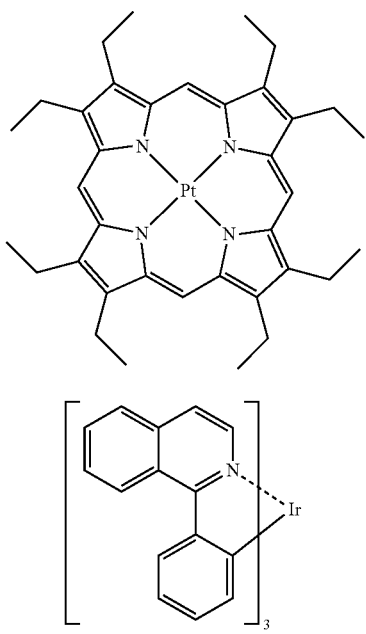

PtOEP

Ir(piq)3

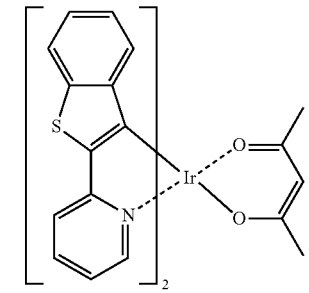

Btp2Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

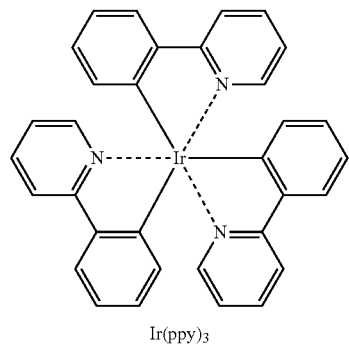

Ir(ppy)3

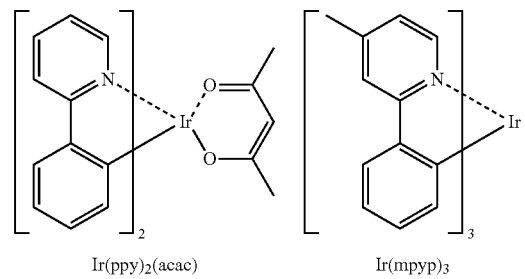

Ir(ppy)2(acac)    Ir(mpyp)3

Compound 3

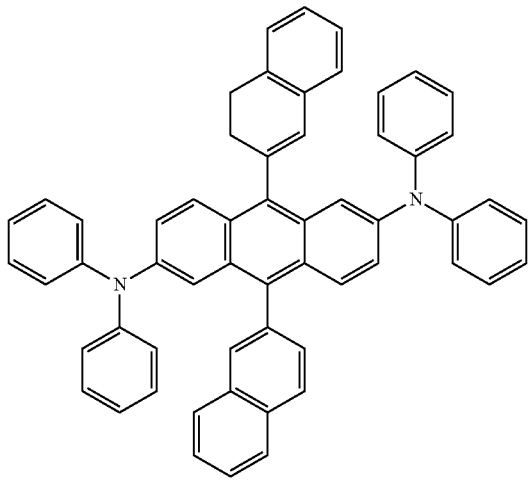

Examples of a phosphorescent blue dopant are $F_2$Irpic, $(F_2ppy)_2$Ir(tmd) and Ir(dfppz) 3, ter-fluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

F2Irpic

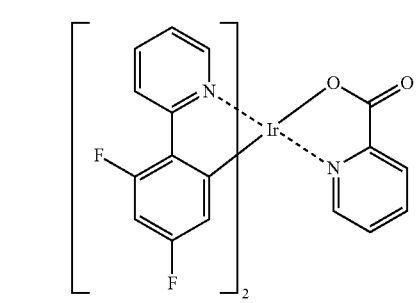

(F2ppy)2Ir(tmd)

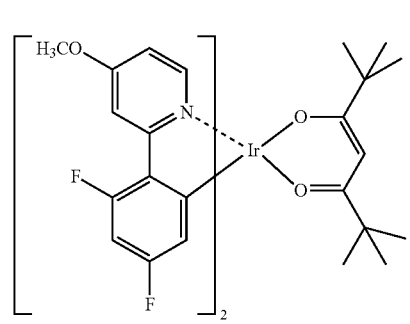

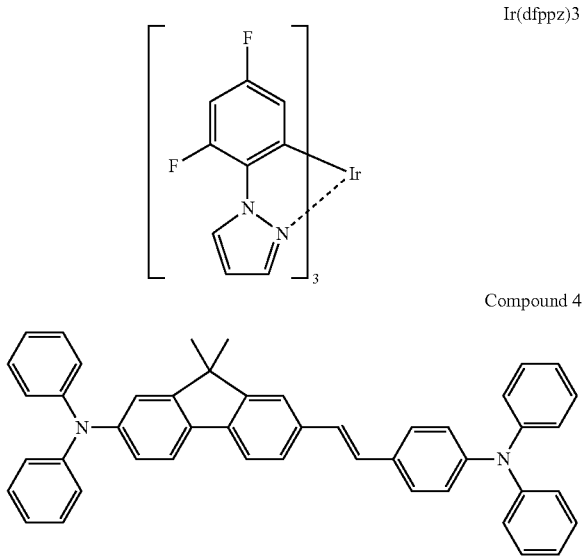

Ir(dfppz)3

Compound 4

The amount of the dopant may be in the range of about 0.01 to about 50 parts by weight, based on 100 parts by weight of the host. The EML 150 may have a thickness of about 10 nm to about 100 nm, for example, about 20 nm to about 60 nm. When the thickness of the EML 150 is within this range, the EML 150 may have excellent light emission, without a substantial increase in driving voltage.

When the EML 150 comprises a phosphorescent dopant, a hole blocking layer (HBL) (not shown) may be formed on the EML 150, by using vacuum deposition, spin coating, slot-die coating, printing, casting, LB deposition, or the like, in order to prevent the diffusion of triplet excitons or holes into the ETL 160. When the HBL is formed using vacuum deposition or spin coating, the conditions for deposition and coating may be similar to those for the formation of the HIL 130. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

The ETL 160 may be formed on the EML 150 or on the HBL if the HBL is formed.

The ETL 160 has a stacked structure, preferably of two ETL-layers (161/162), so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL 160, the first layer 161 and the second layer 162 may have similar or identical energy levels. In general the matrix compound for the first electron layer (161) and second electron layer (162) are different.

The matrix compound for the first electron layer 161 and second electron layer 162 that can be suitable used are selected for example from the group comprising anthracene compounds, preferably 2-(4-(9,10-di(naphthalen-2-yl)anthracen-2-yl)phenyl)-1-phenyl-1H-benzo[d]imidazole; whereby the matrix material of the second electron transport layer 162 is selected different to the matrix material of the first electron transport layer 161 and the optional third electron transport layer 163.

The matrix compound for the electron transport layers of the electron layer stack for the first and the optional third electron transport layers can be selected from a phosphine oxide compound substituted with aryl, heteroaryl or alkyl group, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl) phosphine oxide, (3-(9,10-di(naphthalen-2-yl)anthracen-2-yl)phenyl)diphenyl phosphine oxide, diphenyl(5-(pyren-1-yl)pyridin-2-yl)phosphine oxide, diphenyl(4'-(pyren-1-yl)-[1,1'-biphenyl]-3-yl)phosphine oxide and/or phenyl bis(3-(pyren-1-yl)phenyl)phosphine oxide; whereby the matrix material of the second electron transport layer is not a phosphine oxide compound.

Anthracene compounds that can be used as matrix compounds are disclosed in U.S. Pat. No. 6,878,469 B.

Other matrix compounds that can be used are diphenylphosphine oxide, preferably (3-(dibenzo[c,h]acridin-7-yl)phenyl)diphenylphosphine oxide, phenylbis(3-(pyren-1-yl)phenyl)phosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide.

Diphenylphosphine oxide compounds that can be used as matrix compounds are disclosed in EP 2395571 A1, WO2013079217 A1, EP 13187905, EP13199361 and JP2002063989 A1, incorporated by reference. Other suitable matrix compounds that can be used are phenanthroline compounds, preferably selected from the group comprising 2,4,7,9-tetraphenyl-1,10-phenanthroline and 2,9-di(biphenyl-4-yl)-4,7-diphenyl-1,10-phenanthroline. Phenanthroline compounds that can be used as matrix compounds are disclosed in EP 1786050 A1.

Other suitable matrix compounds that can be used are pyrido[3,2-h]quinazoline compounds, preferably 4-(naphthalen-1-yl)-2,7,9-triphenylpyrido[3,2-h]quinazoline. Pyrido[3,2-h]quinazoline compounds that can be used as matrix compounds are disclosed in EP1970371. Other suitable matrix compounds that can be used are triazine compounds, preferably 4,4'-bis(4,6-diphenyl-1,3,5-triazine-2-yl) biphenyl. Triazine compounds that can be used as matrix compounds are disclosed in U.S. Pat. No. 6,225,467. Other suitable matrix compounds that can be used are acridine compounds, preferably 7-(naphthalen-2-yl)dibenzo[c,h] acridine. Acridine compounds that can be used as matrix compounds are disclosed in EP 2395571.

The matrix compound of the first electron layer (161) and/or second electron transport layer (162) may be a compound that efficiently transports electrons, such as an anthracene-based compound, diphenylphosphine oxide compound, triazine compound, quinazoline compound or a phenanthroline based compound, and preferably a matrix compound mentioned in Table 2; whereby the matrix material of the second electron transport layer 162 is selected different to the matrix material of the first electron transport layer 161 and the optional third electron transport layer 163.

For example, the matrix compound of the first electron layer and/or second electron transport layer may be selected from the group consisting of ADN and referred to as Formula 1, a compound represented by Formula 2, and a compound represented by Formula 3 below; whereby the matrix material of the second electron transport layer is selected different to the matrix material of the first electron transport layer and the optional third electron transport layer:

Formula 1 (ADN)

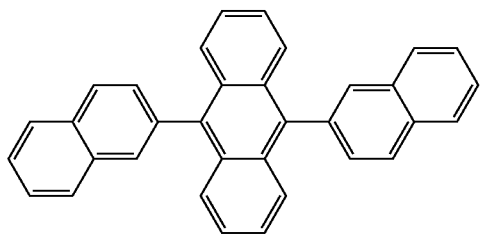

Formula 2

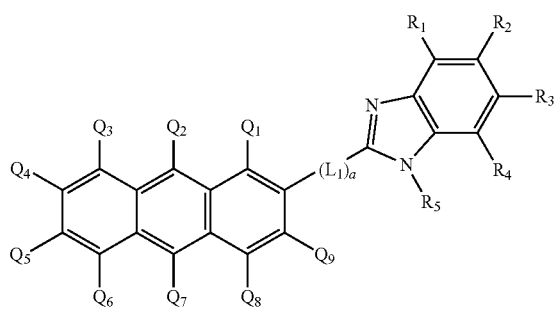

Formula 3

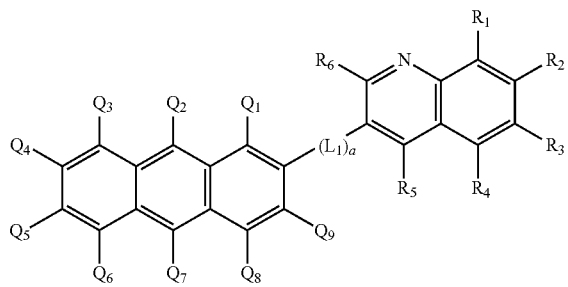

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, $L_1$ may be a phenylene group or a pyridinylene group. For example, "a" may be 1, 2, or, 3.

The matrix compound may be further selected from Compound 6 or 7 below:

Compound 6

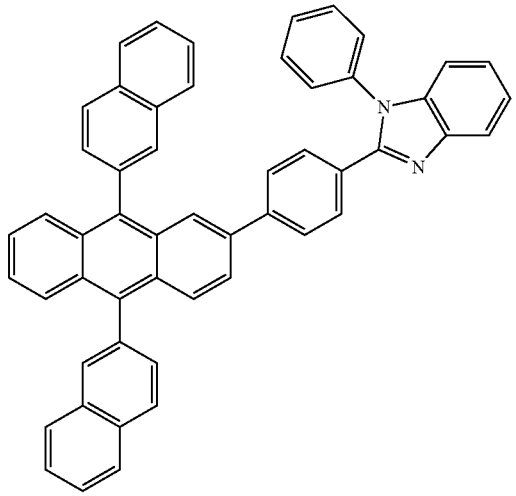 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

Compound 7

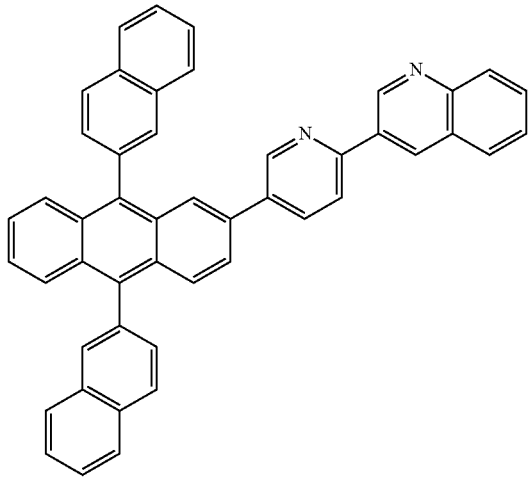

The first electron transport layer 161 comprises a dopant of a lithium halide or a lithium organic complex; and the second electron transport layer 162 is free of a dopant.

According to another aspect the first electron transport layer 161 comprises a lithium halide or a lithium organic complex; and the second electron transport layer 162 comprises no dopant; and the third electron transport layer 163 comprises a lithium halide or a lithium organic complex that is the same or differs from the lithium halide or lithium organic complex of the first electron transport layer 161.

The ETL layer stack thickness can be adjusted such that the light out coupling is maximized. Further ETL layer stack thickness can be adjusted for the desired color tuning, for example to achieve a deeper shade of blue, i.e. smaller CIE-y.

The thicknesses of the first electron transport layer 161, second electron transport layer 162 and/or third electron transport layer 163 may be the same or each independently in the range of about ≥1 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

When the thicknesses of the first electron transport layer 161, second electron transport layer 162 and/or third electron transport layer 163 within this range, preferably of about ≥10 nm to about ≤18 nm, the electron transport layer stack 160 may effectively inject and transport electrons, without a substantial increase in driving voltage.

For blue emitting OLEDs, the thickness of the ETL layer stack is 10 nm to 50 nm, preferably 30 nm to 40 nm. For red and green emitting OLEDs, the thickness of ETLs is 20 nm to 100 nm, preferably 20 nm to 100 nm and more preferably 30 nm to 80 nm. The thickness is selected so as to maximize efficiency of light emission.

The amount of the total lithium organic complex in the first electron transport layer 161 may be in the range of about ≥10 wt.-% to about ≤70 wt.-%, preferably about ≥20 wt.-% to about ≤65 wt.-%, and also preferred about ≥50 wt.-% to about ≤60 wt.-%, by weight of the first electron transport layer 161.

The amount of the total lithium organic complex in the first electron transport layer 161 that is free of a metal salt may be in the range of about ≥10 wt.-% to about ≤70 wt.-%, preferably about ≥20 wt.-% to about ≤65 wt.-%, and also preferred about ≥50 wt.-% to about ≤60 wt.-%, by weight of the first electron transport layer 161.

The amount of the total lithium organic complex in the third electron transport layer 163 may be in the range of about ≥10 wt.-% to about ≤70 wt.-%, preferably about ≥20 wt.-% to about ≤65 wt.-%, and also preferred about ≥50 wt.-% to about ≤60 wt.-%, by weight of the third electron transport layer 163.

The amount of the total lithium organic complex in the third electron transport layer 163 that is free of a metal salt may be in the range of about ≥10 wt.-% to about ≤70 wt.-%, preferably about ≥20 wt.-% to about ≤65 wt.-%, and also preferred about ≥50 wt.-% to about ≤60 wt.-%, by weight of the third electron transport layer 163.

The ETL-stack 160 may be formed on the EML 150 by vacuum deposition, spin coating, slot-die coating, printing, casting, or the like. When the ETL 160 is formed by vacuum deposition or spin coating, the deposition and coating conditions may be similar to those for formation of the HIL 130. However, the deposition and coating conditions may vary, according to a compound that is used to form the ETL-stack 160.

Using vacuum deposition, the first electron transport layer 161 of the ETL 160 may be formed using a first deposition source to deposit a matrix compound and a second deposition source to deposit a lithium halide or lithium organic complex. The first deposition source and second deposition source are positioned relative to one another, such that a mixed deposition region of the first electron transport layer 161 is formed directly on the EML 150.

The second electron transport layer 162 of the ETL 160 may be formed using a third deposition source, since the matrix compound is different to the first electron transport layer ETL 161 and optional third electron transport layer ETL 163.

If compounds used to form the first ETL 161 and third ETL 163 are identical, than the same deposition sources can be used.

If compounds used to form the first ETL 161 and third ETL 163 are not identical, than the additional deposition sources can be used for the third ETL 163.

The deposition sources are positioned relative to one another, such that the second electron transport layer 162 is formed directly on the first electron transport layer 161.

The stacking process is more simply and quickly performed, as compared to prior methods. In particular, since a plurality of ETL layers may be almost simultaneously deposited in a single chamber, the chamber may not be required to be exhausted after the formation of each layer.

The EIL 180, which facilitates injection of electrons from the cathode, may be formed on the ETL 160, preferably directly on the second electron transport layer 162. Examples of materials for forming the EIL 180 include KF, LiF, NaCl, CsF, $Li_2O$, BaO, Ca, Ba, Yb, Mg which are known in the art. Deposition and coating conditions for forming the EIL 180 are similar to those for formation of the HIL 130, although the deposition and coating conditions may vary, according to a material that is used to form the EIL 180.

According to one aspect the electron injection layer may comprises a matrix compound of a phosphine oxide compound substituted with aryl, heteroaryl or alkyl group, preferably 3-Phenyl-3H-benzo[b]dinaphtho[2,1-d:1',2'-f]phosphepine-3-oxide, and doped with a lithium halide or doped with a lithium organic complex, preferably lithium tetra(1H-pyrazol-1-yl)borate.

According to one aspect the electron injection layer may comprises a matrix compound of a phosphine oxide compound substituted with aryl, heteroaryl or alkyl group, preferably (3-(dibenzo[c,h]acridin-7-yl)phenyl)diphenylphosphine oxide or 3-Phenyl-3H-benzo[b]dinaphtho[2,1-d:1',2'-f]phosphepine-3-oxide, and doped with an elemental metal selected from a group comprising an alkali, alkaline earth or rare earth metals, preferably Li, Cs, Mg, Ca, Yb, or Sm.

According to one aspect the electron injection layer may consist of a metal halide or organic complex, preferably LiQ, AlQ3, ZrQ4, KF or LiF, wherein Q is a 8-hydroxyquinolate.

According to one aspect the electron injection layer may consist of an alkali, alkaline earth or rare earth metal, preferably Li, Cs, Mg, Ca, Yb, or Sm.

According to a preferred embodiment the electron transport layer stack of two electron transport layers 161/162 may contain an electron injection layer 180.

According to a preferred embodiment the electron transport layer stack of three electron transport layers 161/162/163 may not contain an electron injection layer 180.

The thickness of the EIL 180 may be in the range of about 0.1 nm to 10 nm, for example, in the range of 0.5 nm to 9 nm or about ≥0.5 nm to ≤5 nm. When the thickness of the EIL 180 is within this range, the EIL 180 may have satisfactory electron-injecting properties, without a substantial increase in driving voltage.

The cathode electrode 190 is formed on the EIL 180 if present. The cathode electrode 190 may be a cathode, which is an electron-injecting electrode. The second electrode 190 may be formed of a metal, an alloy, an electrically conductive compound, or a mixture thereof. The second electrode 190 may have a low work function. For example, the second electrode 190 may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the second electrode 190 may be formed of a transparent conductive material, such as ITO or IZO.

The thickness of the cathode electrode 190 may be in the range of about 5 nm to 1000 nm, for example, in the range of 10 nm to 100 nm. When the cathode electrode 190 is in the range of 5 nm to 50 nm, the electrode will transparent even if a metal or metal alloy is used.

Since the layers of the ETL 160 have similar or identical energy levels, the injection and transport of the electrons may be controlled, and the holes may be efficiently blocked. Thus, the OLED 100 may have long lifetime.

Figure 6:
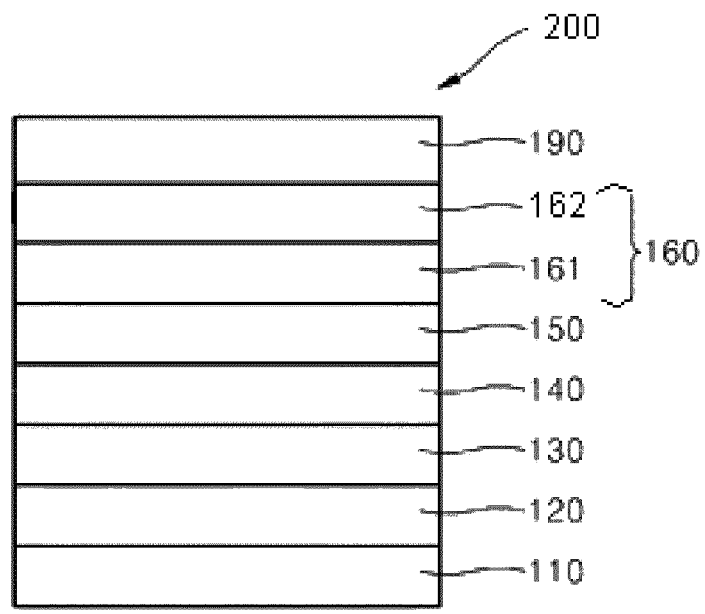
FIG. 6 is a schematic sectional view of an OLED, according to an exemplary embodiment of the present invention with an emission layer and two electron transport layers and having no electron injection layer (EIL).
Figure 7:
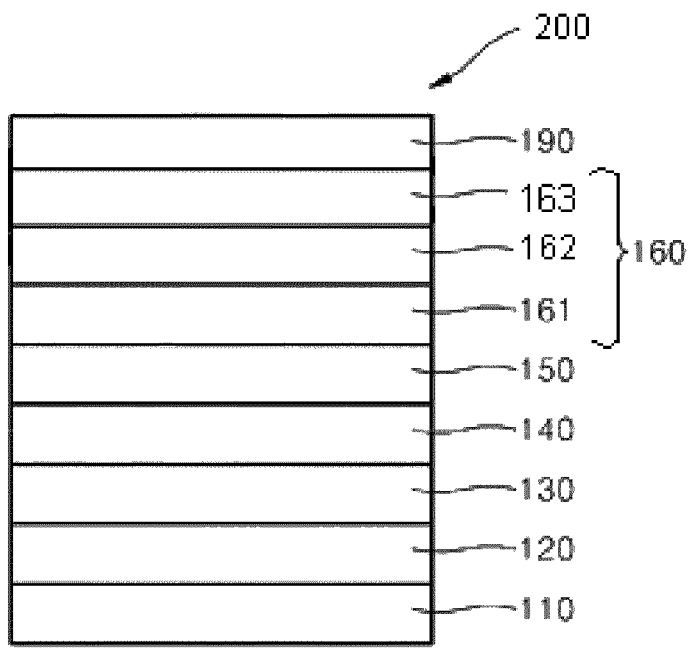
FIG. 7 is a schematic sectional view of an OLED, according to an exemplary embodiment of the present invention with three electron transport layers and having no electron injection layer (EIL).

FIG. 6 and FIG. 7 is a schematic sectional view of an OLED 200, according to another exemplary embodiment of the present invention. The OLED 200 of FIGS. 7 and 8 has no electron injection layer (EIL) 180.

Referring to FIGS. 6 and 7 the OLED 200 includes a substrate 110, a first electrode 120, a HIL 130, a HTL 140, an EML 150, an ETL 160, and a second electrode 190. The ETL stack 160 of FIG. 6 includes a first ETL layer 161 and a second ETL layer 162. The ETL stack 160 of FIG. 7 includes a first ETL layer 161, a second ETL layer 162 and a third ETL layer 163.

The electron transport layer stack 160 of FIG. 6 comprises at least two electron transport layers 161 and 162, wherein a first electron transport layer 161 and a second electron transport layer 162 comprises at least one matrix compound, whereby the matrix compound of the second electron transport layer 162 differs from the matrix compound of the first electron transport layer 161, and in addition, the first electron transport layer comprises as a dopant at least one lithium organic complexes, and the second electron transport layer comprises no dopant; wherein the first electron transport layer is arranged closest to an anode and the second electron transport layer is arranged closest to a cathode.

The electron transport layer stack 160 of FIG. 7 comprises at least three electron transport layers 161, 162 and 163, wherein a first electron transport layer 161, a second electron transport layer 162 and a third electron transport layer 163 comprises at least one matrix compound, whereby the matrix compound of the second electron transport layer 162 differs from the matrix compound of the first electron transport layer 161 and third electron transport layer 163, and in addition, the first electron transport layer 161 comprises as a dopant a lithium halide or lithium organic complex, the third electron transport layer 163 comprises as a dopant a lithium halide or lithium organic complex, and the second electron transport layer 162 is free of a dopant; wherein the first electron transport layer 161 is arranged closest to an anode and the third electron transport layer 163 is arranged closest to a cathode.

The layers of the ETL 161 and 162 or of the ETL 161 and 163 have similar or identical energy levels.

The OLED 200 have a significant reduced low voltage to efficiently operate an OLED. The substrate 110, the first electrode 120, the hole injection layer 130, the hole transport layer 140, the emission layer 150, and the electron transport layer 161 and 162 of the OLED 200 of FIG. 6 and FIG. 7 are similar to corresponding elements described with reference to FIGS. 4 and 5, respectively. Even though the structure of the OLED 200 and the method of manufacturing the OLED 200 are described with reference to FIGS. 4 and 5, other methods known in the art can be used. For example, the ETL stack 160 may include three or more ETL layers but two ETL layers of ETL 161 and 162 or three two ETL layers of ETL 161, 162 and 163 may be preferred.

In the description above the method of manufacture an OLED of the present invention is started with a substrate 110 onto which an anode electrode 120 is formed, on the anode electrode 120 an emission layer 150 is formed. An electron transport layer 161 or electron transport layer stack 160 is formed on the emission layer 150, wherein in case of an electron transport layer stack 160 the first electron transport layer 161 is formed on the emission layer 150 and the second electron transport layer 162 is formed directly on the first electron transport layer 161, on the electron transport layer stack 160, in this case on the second electron transport layer 162, a cathode electrode 190 is formed, optional a hole injection layer 130, and a hole transport layer 140, are formed between the anode electrode 120 and the electron transport layer stack 160, an optional hole blocking layer is formed between the emission layer and the ETL layer stack, and an electron injection layer 180 is formed between the electron transport layer 160 and the cathode electrode 190.

However, the OLED of the present invention can be manufactured also the other way around, starting with the cathode electrode 190 onto which optionally an electron injection layer 180 is formed. On the cathode electrode 190 or on the electron injection layer 180, if present, the electron transport layer stack 160 is formed, whereby directly on the second electron transport layer 162 the first electron transport layer 161 is formed, and so on.

In case of a three layer electron transport layer stack 160, the second electron layer 162 is formed on the first electron layer 161 and the third electron layer 163 is formed on the second electron layer 162. Then a cathode electrode 190 is formed, optional a hole injection layer 130, and a hole transport layer 140, are formed between the anode electrode 120 and the electron transport layer stack 160, an optional hole blocking layer is formed between the emission layer and the ETL layer stack, and optionally an electron injection layer 180 is formed between the electron transport layer 160 and the cathode electrode 190.

While not shown in FIGS. 4 to 7, a sealing layer may further be formed on the second electrodes 190, in order to seal the OLEDs 100, 200. In addition, various other modifications may be applied thereto.

Hereinafter, one or more exemplary aspects will be described in detail with, reference to the following examples. However, these examples are not intended to limit the purpose and scope of the one or more exemplary aspects.

EXAMPLES

General Procedure for Comparative Examples 1 to 4 and ETL Stacks Comprising Two Electron Transport Layers For bottom emission devices, a 15 Ω/cm² glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

For top emission devices, the anode electrode was formed from 100 nm silver on glass which was prepared by the same methods as described above.

Then, 92 wt.-% of N4,N4"-di(naphthalen-1-yl)-N4,N4"-diphenyl-[1,1':4',1"-terphenyl]-4,4"-diamine and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then N4,N4"-di(naphthalen-1-yl)-N4,N4"-diphenyl-[1,1':4',1"-terphenyl]-4,4"-diamine was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then the ETL-layer stack is formed by depositing the first electron transport layer (ETL 1) including a matrix compound according to Example 1 to Example 5 and comparative examples 1 and 2 by deposing the matrix compound from a first deposition source and the lithium organic complex from a second deposition source directly on the EML.

The second electron transport layer (ETL 2) for examples 1 to 5 including a matrix compound is formed by deposing the matrix compound from a third deposition source, since the matrix material is different to the matrix material of the first electron transport layer (ETL 1). For the comparative examples 1 to 2 only one electron transport layer ETL 1 is formed. The wt.-% of the lithium organic complex for the ETL1 can be taken from Table 4, whereby the wt.-% amount of the matrix compound is added to 100 wt.-%, respectively. That means, that the matrix compound of ETL 1 are added in a wt.-% amount such that the given wt.-% of the lithium organic complex for the ETL1 and the matrix compound of the ETL 1 are in total 100 wt.-%, based on the weight of the ETL 1. Further, the thickness d (in nm) of the ETL 1 can be taken from Table 4. The cathode was evaporated at ultra-high vacuum of $10^{-7}$ bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For top emission devices, the cathode electrode was formed from 13 nm magnesium (90 vol.-%) and silver (10 vol.-%) alloy, followed by 60 nm N4,N4"-di(naphthalen-1-yl)-N4,N4"-diphenyl-[1,1':4',1"-terphenyl]-4,4"-diamine. For bottom emission devices, the cathode electrode was formed from 100 nm aluminum.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 15 mA/cm², a calibrated spectrometer CAS140 from Instrument Systems is used for measurement of CIE coordinates and brightness in Candela. Lifetime LT of the device is measured at ambient conditions (20° C.) and 15 mA/cm², using a Keithley 2400 sourcemeter, and recorded in hours. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm².

In top emission devices, the emission is forward directed, non-Lambertian and also highly dependent on the mircocavity. Therefore, the efficiency EQE will be higher compared to bottom emission devices. To determine the efficiency EQE in % the light output of the device is measured using a calibrated photodiode at 15 mA/cm².

In Table 4, comparative device stacks without a second ETL are compared with examples containing a second ETL. Comparative examples 1 and 2 contain a single ETL. The voltage of Comparative example 1 is comparable to Comparative example 2, which additionally contains an EIL. Table 4 shows that the voltage of Comparative example 2 is increased by 0.1 V compared to Comparative example 1. The EIL has practical no effect on the voltage.

Example 1 contains a first and second ETL and EIL. Compared to the Comparative example 2, the voltage according to Example 1 is decreased by 0.49 V. Insertion of a second ETL between the first ETL and EIL has a clear beneficial effect on conductivity.

Effect of LUMO Level of ETL2 Relative to ETL1

Reduction and oxidation potentials are determined via cyclic voltammetry, using the Ferrocene/Ferrocenium (Fc/Fc⁺) redox couple as internal reference. A simple rule is very often used for the conversion of redox potentials into electron affinities and ionization potential: IP (in eV)=4.84 eV+e*Eox (wherein Eox is given in volts vs. ferrocene/ferrocenium (Fc/Fc⁺) and EA (in eV)=4.84 eV+e*Ered (Ered is given in volts vs. Fc/Fc⁺) respectively (see B. W. D'Andrade, Org. Electron. 6, 11-20 (2005)), e* is the elemental charge. It is common practice, even if not exactly correct, to use the terms "energy of the HOMO" E(HOMO) and "energy of the LUMO" E(LUMO), respectively, as synonyms for the ionization energy and electron affinity (Koopmans Theorem).

In Example 1, the ETL2 is selected from a triazine matrix compound. The ETL2 has a LUMO level which is 0.17 eV deeper, that means further away from vacuum level than the LUMO level of ETL1.

In Example 2, the ETL2 is selected from a pyrido[3,2-h] quinazoline matrix compound. The ETL2 has a LUMO level which is 0.02 eV deeper than the LUMO level of ETL1. The voltage is reduced by 0.54 V compared to Example 1.

In Example 3, the ETL2 is selected from a phenanthroline matrix compound. The ETL2 has a LUMO level which is 0.17 eV shallower, that means closer to vacuum level than the LUMO level of ETL1. The voltage is reduced by 0.52 V compared to Example 1.

TABLE 4

Voltage, external quantum efficiency (EQE) and lifetime of bottom emission OLEDs with two electron transport layers

| | ETL1 | wt.-% Li organic complex*[1] | d (ETL1)/ nm | ETL2*[2] | d (ETL2)/ nm | EIL | wt.-% Li organic complex*[3] | d (EIL)/ nm | V at 10 mA/cm$^2$/V | EQE*[4]/ % | LT/h |
|---|---|---|---|---|---|---|---|---|---|---|---|
| Comparative Example 1 | MX 11: Li-2 | 50 | 36 | — | — | — | — | — | 4.77 | 6.8 | 98 |
| Comparative Example 2 | MX 11: Li-2 | 50 | 36 | — | — | MX 12: Li-1 | 30 | 2.4 | 4.87 | 6.7 | 103 |
| Example 1 | MX 11: Li-2 | 50 | 10 | MX 20 | 26 | MX 12: Li-1 | 30 | 2.4 | 4.36 | 6.1 | 170 |
| Example 2 | MX 11: Li-2 | 50 | 10 | MX 19 | 25 | MX 12: Li-1 | 30 | 3.2 | 3.82 | 6.9 | 35 |
| Example 3 | MX 11: Li-2 | 50 | 10 | MX 14 | 25 | MX 12: Li-1 | 30 | 3.2 | 3.84 | 7.2 | 30 |
| Example 4 | MX: 12: Li-2 | 60.6 | 1 | MX 4 | 33 | LiQ | — | 2 | 3.65 | 6.9 | 17 |
| Example 5 | MX-1: LiQ | 50 | 5 | ADN | 31 | MX 12: Li-1 | 30 | 3 | 3.6 | 7 | 32 |

*[1] = the wt.-% of the matrix compound MX and the wt.-% of the lithium organic complex Li-2 are in total 100 wt.-% based on the weight of the ETL1.
*[2] = the wt.-% of the matrix compound of the second electron transport layer ETL 2 is 100 wt.-% based on the weight of the ETL2.
*[3] = the wt.-% of the matrix compound MX 12 and the wt.-% of the lithium organic complex Li-1 are in total 100 wt.-% based on the weight of the EIL.
*[4] = detecting the light output efficiency with a calibrated photo diode.

Technical Effect of the Invention

Bottom Emission Devices with Two Electron Transport Layers

In Table 4 results are shown for bottom emission devices with one electron transport layer (ETL1) containing a matrix compound MX 11 and an lithium organic complex Li-2; and for bottom emission devices with a first electron transport layer (ETL1) containing a matrix compound MX 11 and an lithium organic complex Li-2 and a second electron transport layer (ETL2) that is formed of a matrix compound MX 20 (example 1), MX 19 (example 2), MX 14 (Example 3), MX 4 (Example 4) or ADN (Example 5). For examples 1 to 5 a voltage reduction to operate the OLED is observed compared to the emission device with one electron transport layer (ETL1) only, containing a matrix compound MX 11 and an lithium organic complex Li-2 (comparative examples 1 and 2).

In comparison to devices without second ETL (comparative examples 1 and 2), a reduction in voltage has been achieved independent of the LUMO level of ETL2 relative to ETL1.

In Example 4, ETL1 comprises phosphine oxide matrix MX12 and lithium organic complex Li-2. The thickness of ETL1 is 1 nm. ETL2 comprises benzimidazole matrix compound MX4. The voltage is reduced to 3.65 V.

In Example 5, ETL1 comprises a benzimidazole matrix compound MX1 and lithium organic complex LiQ and ETL2 comprises anthracene matrix compound ADN. The voltage is reduced compared to Example 1 and 2. In conclusion, very low voltages can be achieved for phosphine oxide and benzimidazole matrix compounds in ETL1.

A voltage reduction has the benefit that the energy required to operate the OLED can be reduced. The OLEDS of the present invention shows a significant voltage reduction which is an improvement in saving electrical energy compared to the prior art.

Another aspect is directed to a device comprising at least one or a plurality of organic light-emitting diodes (OLED). A device comprising organic light-emitting diodes is for example a display.

Bottom Emission Devices with Three Electron Transport Layers

General Procedure for Comparative Example 3 and ETL Stacks Comprising Three Electron Transport Layers 161, 162, and 163

For bottom emission devices, a 15 Ω/cm$^2$ glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 92 wt.-% of biphenyl-4-yl(9,9-diphenyl-9H-fluoren-2-yl)-[4-(9-phenyl-9H-carbazol-3-yl)phenyl]-amine and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then the ETL-layer stack is formed by depositing the first and third electron transport layer (ETL 1 and ETL 3) including a matrix compound according to example 6 to example 11 by deposing the matrix compound from a first deposition source and the lithium organic complex from a second deposition source directly on the EML.

The second electron transport layer (ETL 2) for examples 6 to 11 including a matrix compound is formed by deposing the matrix compound from a third deposition source, since the matrix material is different to the matrix material of the first and third electron transport layer (ETL 1 and ETL 3). For the comparative example 3 only one electron transport layer ETL 1 is formed. The wt.-% of the lithium organic complex for the ETL1 and ETL 3 can be taken from Table 5, whereby the wt.-% amount of the matrix compound is added to 100 wt.-%, respectively. That means, that the matrix compound of ETL 1 and ETL 3 are added in a wt.-% amount such that the given wt.-% of the lithium organic complex for the ETL1 and ETL 3 and the matrix compound of the ETL 1 and ETL 3 are in total 100 wt.-%, based on the weight of the ETL 1 and ETL 3. Further, the thickness d (in nm) of the ETL 1 and ETL 3 can be taken from Table 5. The cathode was evaporated at ultra-high vacuum of $10^{-7}$ bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For bottom emission devices, the cathode electrode was formed from 100 nm aluminum.

The OLED stack is protected from ambient conditions by encapsulation of the device with a glass slide. Thereby, a cavity is formed, which includes a getter material for further protection.

The performance of the inventive examples compared to the prior art was assessed as described in the General Process for ETL stacks comprising two electron transport layers above.

In Table 5, comparative device stacks without a second and third ETL are compared with examples 6 to 11 containing a second and third ETL.

In example 7 to example 9, different thicknesses of the first and second ETL are compared. The thickness of the first ETL was varied between 5 and 21 nm, the thickness of the second ETL was varied between 13 and 29 nm and the thickness of the third ETL was kept constant at 3 nm. The overall thickness of the ETL layer stack was kept constant at 37 nm. As can be seen in Table 5, independent of the thickness of the first and second ETL, the voltage is always lower compared to comparative example 3 with a single ETL. The best performance in terms of voltage is achieved for a very thin first ETL, see example 10 compared to example 7. The thickness of the first ETL has been reduced by 16 nm and the voltage is reduced by 0.37 V. Oppositely, the thickness of the second ETL has been increased from 13 nm in example 5 to 29 nm in example 10. The increase in thickness of the second ETL goes hand in hand with a reduction in voltage by 0.37 V.

In summary, the thickness of the first and second ETL can be varied between a wide range of thicknesses without loss in performance.

In example 11 Li-2 is used as dopant in the first and third ETL compared to example 7, where LiQ was used. As can

TABLE 5

Voltage, external quantum efficiency (EQE) and lifetime of bottom emission OLEDs with three electron transport layers and no EIL

| | ETL1 | wt.-% Li organic complex*[1] | d (ETL1)/ nm | ETL2*[2] | d (ETL2)/ nm | ETL 3 | wt.-% Li organic complex*[3] | d (ETL 3)/ nm | V at 10 mA/ cm$^2$/V | EQE*[4]/ % | LT/h |
|---|---|---|---|---|---|---|---|---|---|---|---|
| Comparative Example 3 | MX 23: LiQ | 50 | 36 | — | — | — | — | — | 4.87 | 5.3 | 400 |
| Example 6 | MX 23: LiQ | 50 | 21 | MX 24 | 13 | MX 23: LiQ | 53 | 4 | 4.33 | 6.7 | 125 |
| Example 7 | MX 23: LiQ | 50 | 21 | MX 19 | 13 | MX 23: LiQ | 51 | 3 | 4.34 | 6.9 | 210 |
| Example 8 | MX 23: LiQ | 50 | 15 | MX 19 | 19 | MX 23: LiQ | 51 | 3 | 4.16 | 7.2 | 100 |
| Example 9 | MX 23: LiQ | 50 | 11 | MX 19 | 23 | MX 23: LiQ | 51 | 3 | 4.04 | 7.5 | 53 |
| Example 10 | MX 23: LiQ | 50 | 5 | MX 19 | 29 | MX 23: LiQ | 51 | 3 | 3.97 | 7.9 | 28 |
| Example 11 | MX 23: Li-2 | 50 | 21 | MX 19 | 13 | MX 23: Li-2 | 48 | 3 | 4.32 | 8.6 | 20 |

*[1] = the wt.-% of the matrix compound MX 23 and the wt.-% of the lithium organic complex LiQ or Li-2 are in total 100 wt.-% based on the weight of the ETL1.
*[2] = the wt.-% of the matrix compound of the second electron transport layer ETL 2 is 100 wt.-% based on the weight of the ETL2.
*[3] = the wt.-% of the matrix compound MX 23 and the wt.-% of the lithium organic complex LiQ or Li-2 are in total 100 wt.-% based on the weight of the EIL.
*[4] = detecting the light output efficiency with a calibrated photo diode.

Comparative example 3 contains a single ETL. The voltage of comparative example 3 in Table 5 is comparable to comparative example 1 in Table 4. These results show that the performance is independent of the exact structure of the matrix compound and Li organic complex used.

Example 6 contains a first, second and third ETL. Compared to the comparative example 3, the voltage according to example 6 is decreased by 0.54 V. Insertion of a second and third ETL between the first ETL and cathode has a clear beneficial effect on conductivity.

Example 7 contains a different matrix compound in the second ETL compared to example 4. A pyrido[3,2-h]quinazoline compound, 4-(naphthalen-1-yl)-2,7,9-triphenylpyrido[3,2-h]quinazoline (MX 19) was used in place of acridine compound, 7-(naphthalen-2-yl)dibenzo[c,h]acridine (MX 24). The LUMO level of MX 19 is 0.07 eV shallower (closer to vacuum level) compared to MX 24. As can be seen in Table 5, the voltage is very similar, even though the chemical structure of the matrix compound in the second ETL is very different.

be seen in Table 5, the voltage is very similar for example 7 and example 11. The improved performance compared to comparative example 3 can be achieved irrespective of the exact chemical structure of the Li organic complex.

Top Emission Devices with Two Electron Transport Layers

Top emission devices are fabricated as described above with the exception of the matrix compound used in the hole injection layer and hole transport layer. In top emission devices Biphenyl-4-yl(9,9-diphenyl-9H-fluoren-2-yl)-[4-(9-phenyl-9H-carbazol-3-yl)phenyl]-amine is used instead of N4,N4"-di(naphthalen-1-yl)-N4,N4"-diphenyl-[1,1':4',1"-terphenyl]-4,4"-diamine as matrix compound.

Results are shown in Table 6 for top emission devices comprising two electron transport layers.

In comparative example 4, a single electron transport layer comprising phosphine oxide matrix MX12 and lithium organic complex Li-2 is used. The voltage is 5.1 V.

In Example 12, a first electron transport layer with the same composition is used as in comparative example 4. A second electron transport layer comprising benzimidazole matrix compound MX 4 is used. The electron injection layer comprises lithium organic complex LiQ. The voltage is reduced to 4.2 V.

In conclusion, the beneficial technical effect on voltage is observed not only in bottom emission but also in top emission devices.

TABLE 6

Voltage, external quantum efficiency (EQE) and lifetime of top emission OLEDs with two electron transport layers

| | ETL1 | wt.-% Li organic complex*[1] | d (ETL1)/ nm | ETL2*[2] | d (ETL2)/ nm | EIL | d (EIL)/ nm | V at 10 mA/ cm$^2$/V | EQE*[3]/ % | LT/h |
|---|---|---|---|---|---|---|---|---|---|---|
| Comparative Example 4 | MX 12: Li-2 | 60 | 37 | — | — | — | — | 5.1 | 9.25 | 260 |
| Example 12 | MX 12: Li-2 | 60 | 4 | MX 4 | 33 | LiQ | 2 | 4.2 | 10 | 49 |

*[1]= the wt.-% of the matrix compound MX 12 and the wt.-% of the lithium organic complex Li-2 are in total 100 wt.-% based on the weight of the ETL1.
*[2]= the wt.-% of the matrix compound of the second electron transport layer ETL 2 is 100 wt.-% based on the weight of the ETL2.
*[3]= detecting the light output efficiency with a calibrated photo diode.

The ETL layer stack according to this invention may also be employed for other emission colors, for example green, red, and white-light emitting devices.

Another aspect is directed to a device comprising at least one organic light-emitting diode (OLED). A device comprising organic light-emitting diodes (OLED) is for example a display.

From the foregoing detailed description and examples, it will be evident that modifications and variations can be made to the compositions and methods of the invention without departing from the spirit and scope of the invention. Therefore, it is intended that all modifications and/or combinations of embodiments made to the invention without departing from the spirit and scope of the invention come within the scope of the appended claims.

The invention claimed is:

1. An organic light-emitting diode (OLED) comprising an emission layer and an electron transport layer stack of at least two electron transport layers, wherein a first electron transport layer and a second electron transport layer comprises at least one matrix compound, wherein
the matrix compound or compounds of the first electron transport layer is/are different to the matrix compound or compounds of the second electron transport layer; and in addition,
the first electron transport layer comprises a dopant of a lithium halide and/or lithium organic complex; and
the second electron transport layer is free of a dopant;
wherein the matrix compound of the first electron transport layer and/or second electron transport layer is a phosphine oxide.

2. The OLED according to claim 1, wherein the dopant or dopants of the electron transport layer stack or electron transport layer are non-light-emitting dopants.

3. The OLED according to claim 1, wherein the electron transport layer stack has two to four electron transport layers.

4. An organic light-emitting diode (OLED) comprising an emission layer and an electron transport layer stack of at least two electron transport layers, wherein a first electron transport layer and a second electron transport layer comprises at least one matrix compound, wherein
the matrix compound or compounds of the first electron transport layer is/are different to the matrix compound or compounds of the second electron transport layer; and in addition,
the first electron transport layer comprises a dopant of a lithium halide and/or lithium organic complex; and
the second electron transport layer is free of a dopant; wherein
the electron transport layer stack has three electron transport layers, wherein
the first electron transport layer and the third electron transport layer comprise the same or different matrix compound and the same or different dopant; and
the second electron transport layer contains a matrix compound that differs from the matrix compound of the first and third transport layers and is free of a dopant.

5. The OLED according to claim 1, wherein the OLED comprises an electron injection layer, which is arranged between the electron transport layer stack and a cathode electrode; or wherein the OLED comprises an electron injection layer which is arranged between the electron transport layer stack and the cathode electrode, wherein the electron transport layer stack is formed of two electron transport layers.

6. The OLED according to claim 1, wherein:
the lithium halide is selected from the group comprising LiF, LiCl, LiBr or LiJ; and/or
the lithium organic complex, is selected from the group comprising a lithium quinolate, a lithium borate, a lithium phenolate, a lithium pyridinolate or a lithium Schiff base.

7. An organic light-emitting diode (OLED) comprising an emission layer and an electron transport layer stack of at least two electron transport layers, wherein a first electron transport layer and a second electron transport layer comprises at least one matrix compound, wherein
the matrix compound or compounds of the first electron transport layer is/are different to the matrix compound or compounds of the second electron transport layer and in addition,
the first electron transport layer comprises a dopant of a lithium halide and/or lithium organic complex; and
the second electron transport layer is free of a dopant; wherein
the first electron transport layer comprises about <90 wt.-% to about >30 wt-%, of a matrix compound; or the first electron transport layer and a third electron transport layer comprises each about <90 wt.-% to about >30 wt.-%, of a matrix compound; wherein the weight percent of the matrix compound is based on the total weight of the corresponding transport layer.

8. The OLED according to claim 1, wherein the second electron transport layer consists of at least one matrix compound.

9. The OLED according to claim 1, wherein
the first electron transport layer comprises about >10 wt.-% to about <70 wt-%, of a lithium halide or a lithium organic complex; or
the first electron transport layer and a third electron transport layer comprises each about >10 wt.-% to about <70 wt.-%, of a lithium halide or a lithium organic complex;
wherein the weight percent of the lithium halide and the lithium organic complex is based on the total weight of the corresponding electron transport layer.

10. An organic light-emitting diode (OLED) comprising an emission layer and an electron transport layer stack of at least two electron transport layers, wherein a first electron transport layer and a second electron transport layer comprises at least one matrix compound, wherein
the matrix compound or compounds of the first electron transport layer is/are different to the matrix compound or compounds of the second electron transport layer; and in addition,
the first electron transport layer comprises a dopant of a lithium halide and/or lithium organic complex; and
the second electron transport layer is free of a dopant; wherein
the first electron transport layer, or the first electron transport layer and a third electron transport layer, comprises:
a) about >10 wt.-% to about <70 wt.-% of the dopant;
b) about <90 wt.-% to about >30 wt.-% of a matrix compound;
the second electron transport layer, which is free of a dopant, comprises a matrix compound that is selected different from the first electron transport layer and the optional third electron transport layer; and the wt.-% of the components of each electron transport layer is selected such that the total wt.-% amount does not exceed 100 wt.-% and the wt.-% of the components are based on the total weight of the corresponding transport layer.

11. The OLED comprising the electron transport layer stack according to claim 1, wherein the second electron transport layer is formed directly on the first electron transport layer and optionally a third electron transport layer is formed directly on the second electron transport layer.

12. The OLED according to claim 1 comprising: a substrate; an anode electrode is formed on the substrate; the electron transport layer stack is formed on the anode electrode, whereby the electron transport layer stack comprises or consists of the at least two electron transport layers; and finally a cathode electrode is formed, so that the electron transport layer stack is sandwiched between the anode electrode and the cathode electrode; and optionally an electron injection layer is arranged between the electron transport layer and the cathode electrode.

13. The OLED according to claim 1, further comprising at least one layer selected from the group consisting of a hole injection layer, a hole transport layer and a hole blocking layer, formed between the anode electrode and the electron transport layer.

14. A method of manufacturing an organic light-emitting diode (OLED) according to claim 1, the method using:
at least three deposition sources; and/or
deposition via vacuum thermal evaporation; and/or
deposition via solution processing.

15. A method of manufacturing an organic light-emitting diode (OLED) according to claim 14, the method using:
a first deposition source to release the matrix compound, and
a second deposition source to release lithium halide or lithium organic complex;
the method comprising the steps of forming the electron transport layer stack;
whereby the first electron transport layer is formed by releasing the matrix compound from the first deposition source and the lithium halide or lithium organic complex from the second deposition source;
onto the first electron transport layer the second electron transport layer is formed by releasing the matrix compound from a third deposition source;
wherein the matrix compound of the first electron transport layer is not the same as the matrix compound of the second electron transport layer.

16. The method according to claim 14, comprising the steps for an organic light-emitting diode (OLED), wherein
on a substrate an anode electrode is formed,
on the anode electrode an electron transport layer stack is formed,
on the electron transport layer stack a cathode electrode is formed,
optionally a hole injection layer, a hole transport layer, an emission layer, and a hole blocking layer, formed in that order between the anode electrode and the electron transport layer stack,
optionally an electron injection layer is formed between the electron transport layer stack and the cathode electrode.

17. A device comprising at least one organic light-emitting diode (OLED) according to claim 1.

18. The OLED according to claim 14, wherein the phosphine oxide compound is a phosphine oxide substituted with aryl, heteroaryl or alkyl group substituted with aryl, heteroaryl or alkyl groups.

19. The OLED according to claim 16, wherein the phosphine oxide compound is selected from the group comprising (3-(dibenzo[c,h]acridin-7-yl)phenyl) diphenylphosphine oxide, 3-phenyl-3H-benzo[b]dinaphtho[2,1-d: 1',2'-f]phosphepine-3-oxide, phenyldi(pyren-1-yl)phosphine oxide, bis(4-(anthracen-9-yl)phenyl) (phenyl) phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl) phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

20. The OLED according to claim 6, wherein the lithium quinolate has the formula I, II or III:

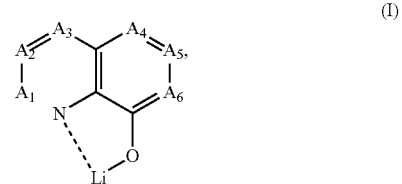

-continued

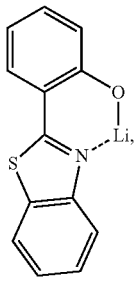
(II)

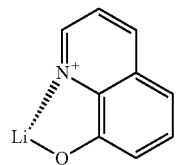
(III)

wherein

A1 to A6 are same or independently selected from CH, CR, N, or O;

R is same or independently selected from hydrogen, halogen, alkyl, or aryl or heteroaryl with 1 to 20 carbon atoms.

21. The method of claim 14, wherein the solution processing is selected from spin-coating, casting, printing, and/or slot-die coating.

22. The method of claim 16, wherein the first electron transport layer is formed on the anode electrode and the second electron transport layer is formed directly on the first electron transport layer.

23. An organic light-emitting diode (OLED) comprising an emission layer and an electron transport layer stack of at least two electron transport layers, wherein the first electron transport layer consist of a matrix compound and a dopant of a lithium halide and/or lithium organic complex and the second electron transport layer consist of a matrix compound, wherein the matrix compound of the first electron transport layer is different to the matrix compound of the second electron transport layer; and in addition the second electron transport layer is free of a dopant; wherein the matrix compound is selected from an a phosphine oxide compound substituted with aryl, heteroaryl or alkyl groups.

* * * * *